US010062692B1

United States Patent
Ray et al.

(10) Patent No.: US 10,062,692 B1
(45) Date of Patent: Aug. 28, 2018

(54) FIELD EFFECT TRANSISTORS WITH REDUCED PARASITIC RESISTANCES AND METHOD

(71) Applicant: GLOBALFOUNDRIES INC., Grand Cayman (KY)

(72) Inventors: Shishir K. Ray, San Diego, CA (US); Bharat V. Krishnan, Mechanicville, NY (US); Jinping Liu, Ballston Lake, NY (US); Meera S. Mohan, Mechanicville, NY (US); Joseph K. Kassim, Menands, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/443,381

(22) Filed: Feb. 27, 2017

(51) Int. Cl.
*H01L 27/092* (2006.01)
*H01L 21/8238* (2006.01)
(Continued)

(52) U.S. Cl.
CPC ........ *H01L 27/092* (2013.01); *H01L 21/0257* (2013.01); *H01L 21/268* (2013.01);
(Continued)

(58) Field of Classification Search
CPC .................. H01L 27/092; H01L 29/456; H01L 21/28518; H01L 29/167; H01L 21/30604;
(Continued)

(56) References Cited

U.S. PATENT DOCUMENTS 7,795,124 B2    9/2010  Nouri et al.
8,415,751 B2    4/2013  Mukherjee et al.
(Continued)

OTHER PUBLICATIONS

Min-hwa Chi, "Challenges in Manufacturing FinFET at 20nm node and beyond", Technology Development, Globalfoundries, Malta, NY 12020, USA, 2012, pp. 1-2.
(Continued)

*Primary Examiner* — Jay C Chang
*Assistant Examiner* — Charles R Peters
(74) *Attorney, Agent, or Firm* — Gibb & Riley, LLC; Francois Pagette

(57) ABSTRACT

Disclosed are methods of forming field effect transistor(s) (FET) and the resulting structures. Instead of forming the FET source/drain (S/D) regions during front end of the line (FEOL) processing, they are formed during middle of the line (MOL) processing through metal plug openings in an interlayer dielectric (ILD) layer. Processes used to form the S/D regions through the metal plug openings include S/D trench formation, epitaxial semiconductor material deposition, S/D dopant implantation and S/D dopant activation, followed by silicide and metal plug formation. Since the post-MOL processing thermal budget is low, the methods ensure reduced S/D dopant deactivation, reduced S/D strain reduction, and reduced S/D dopant diffusion and, thus, enable reduced S/D resistance, optimal strain engineering, and flexible junction control, respectively. Since the S/D regions are formed through the metal plug openings, the methods eliminate overlay errors that can lead to uncontacted or partially contacted S/D regions.

18 Claims, 21 Drawing Sheets

(51) Int. Cl.
  *H01L 21/02* (2006.01)
  *H01L 21/268* (2006.01)
  *H01L 21/306* (2006.01)
  *H01L 29/167* (2006.01)
  *H01L 21/285* (2006.01)
  *H01L 29/45* (2006.01)

(52) U.S. Cl.
  CPC .. *H01L 21/28518* (2013.01); *H01L 21/30604* (2013.01); *H01L 21/823814* (2013.01); *H01L 21/823871* (2013.01); *H01L 29/167* (2013.01); *H01L 29/456* (2013.01)

(58) Field of Classification Search
  CPC ......... H01L 21/823871; H01L 21/0257; H01L 21/823814; H01L 21/268
  See application file for complete search history.

(56) References Cited

U.S. PATENT DOCUMENTS

| | | |
|---|---|---|
| 8,901,537 B2 | 12/2014 | Murthy et al. |
| 9,287,180 B2 | 3/2016 | Liu et al. |
| 2011/0233688 A1* | 9/2011 | Ren .................. H01L 21/84 257/408 |
| 2013/0240989 A1 | 9/2013 | Glass et al. |
| 2013/0248999 A1* | 9/2013 | Glass .................. H01L 29/36 257/335 |
| 2013/0277752 A1* | 10/2013 | Glass .............. H01L 21/823821 257/369 |
| 2015/0287824 A1* | 10/2015 | Ray .................. H01L 29/161 257/190 |
| 2016/0181381 A1 | 6/2016 | Liu et al. |
| 2016/0351709 A1* | 12/2016 | Nishikawa ......... H01L 29/7834 |

OTHER PUBLICATIONS

Hiroaki Niimi et al., "Sub-10-9 Ω-cm2 n-Type Contact Resistivity for FinFET Technology", IEEE Transactions on Electron Device Letters, vol. 37, No. 11, Nov. 2016, pp. 1371-1374.

Atif Noori et al., "Manufacturable Processes for ≤ 32-nm-node CMOS Enhancement by Synchronous Optimization of Strain-Engineered Channel and External Parasitic Resistances", IEEE Transactions on Electron Device Letters, vol. 55, No. 5, May 2008, pp. 1259-1264.

* cited by examiner

FIELD EFFECT TRANSISTORS WITH REDUCED PARASITIC RESISTANCES AND METHOD

BACKGROUND

Field of the Invention

The present invention relates to field effect transistors (FETs) and, more particularly, to methods of forming FETs with reduced parasitic resistance and the resulting integrated circuit (IC) structures.

Description of Related Art

More specifically, as complementary metal oxide semiconductor (CMOS) technologies scale to smaller nodes, smaller critical dimensions can lead to problems that negatively impact device performance. For example, with field effect transistors (FETs), smaller critical dimensions can lead to an increase in parasitics and, particularly, an increase in parasitic resistances, such as metal plug resistance and source/drain region resistance. Additionally, smaller critical dimensions can lead to overlay errors when lithographically patterning openings for metal plugs that will contact source/drain regions. As a result of these overlay errors, the source/drain regions may be uncontacted or only partially contacted. Thus, there is a need in the art for an improved method of forming a FET that minimizes these problems.

SUMMARY

In view of the foregoing, disclosed herein are methods of forming one or more field effect transistors (FETs). In the methods, instead of forming the source/drain (S/D) regions of each FET during front end of the line (FEOL) processing, the S/D regions are formed during middle of the line (MOL) processing and, particularly, through metal plug openings in an interlayer dielectric (ILD) layer. Processes used to form the S/D regions through the metal plug openings include S/D trench formation, epitaxial semiconductor material deposition, S/D dopant implantation and S/D dopant activation (e.g., using an anneal process, such as a nanosecond laser anneal or other suitable anneal process). These processes can be immediately followed by silicide and metal plug formation. Since the post-MOL processing thermal budget is relatively low, the methods ensure reduced S/D dopant deactivation, reduced S/D strain reduction, and reduced S/D dopant diffusion and, as a result, enable reduced S/D resistance, optimal strain engineering, and flexible junction control, respectively. Furthermore, since the S/D regions are formed through the metal plug openings, the methods eliminate the possibility of overlay errors that can lead to uncontacted or only partially contacted S/D regions. Also disclosed herein are integrated circuit (IC) structures with one or more FETs formed according to such methods.

More particularly, disclosed herein is a method of forming at least one field effect transistor (FET). In the method, openings and, particularly, metal plug openings can be formed in an interlayer dielectric (ILD) layer, which is above a semiconductor body and laterally surrounding a gate that is also on the semiconductor body adjacent to a channel region therein. The openings can be formed so that they extend essentially vertically from the top surface of the ILD layer to the top surface of the semiconductor body and such that they are positioned adjacent to opposing sides of the gate. Next, an etch process can be performed to further extend the openings into the semiconductor body, thereby forming source/drain trenches in the semiconductor body on opposing sides of the channel region. An epitaxial semiconductor material can be deposited so as to fill or overfill the source/drain trenches. The epitaxial semiconductor material can be in situ doped and/or subsequently implanted with a dopant. Those skilled in the art will recognize that the type of semiconductor material and the dopant used can vary depending upon whether the FET being formed is an N-type FET (NFET) or a P-type FET (PFET), as discussed in greater detail below with regard to the method. A dopant activation anneal process can then be performed to activate the dopant. Following dopant activation, middle of the line (MOL) processing can be completed.

Also disclosed herein is a method of forming multiple field effect transistors (FETs) including at least one first FET having a first type conductivity (e.g., an NFET) and at least one second FET having a second type conductivity (e.g., a PFET). In the method, a partially completed structure can include a first semiconductor body for the first FET in a first device region and a second semiconductor body for the second FET in a second device region. A first gate can be adjacent to the first semiconductor body at a first channel region and a second gate can be adjacent to the second semiconductor body at a second channel region. An interlayer dielectric layer can laterally surround the first gate and the second gate and can cover portions of the first semiconductor body and the second semiconductor body that extend laterally beyond the first gate and second gate, respectively.

Openings can be formed in ILD layer of this partially completed structure. Specifically, first openings can be formed so that they extend essentially vertically through the ILD layer to a first top surface of the first semiconductor body and such that they are positioned adjacent to first opposing sides of the first gate. Additionally, second openings can be formed so that they extend essentially vertically through the ILD layer to a second top surface of the second semiconductor body and such that they are positioned adjacent to second opposing sides of the second gate. Next, an etch process can be performed to extend the first openings into the first semiconductor body to form first source/drain trenches and to also extend the second openings into the second semiconductor body to form second source/drain trenches.

A first mask can then be formed over the second device region (which contains the second semiconductor body for the second FET) and processing can be performed in order to form first source/drain regions for the first FET. That is, a first epitaxial semiconductor material can be deposited into the first source/drain trenches to form first source/drain regions. The first epitaxial semiconductor material can be in situ doped and/or subsequently implanted with the first dopant. The first mask can then be removed.

Before or after the first source/drain regions are formed, a second mask can be formed over the first device region (which contains the first semiconductor body for the first FET) and processing can be perform in order to form second source/drain regions for the second FET. That is, a second epitaxial semiconductor material can be deposited into the second source/drain trenches to form second source/drain regions. The second epitaxial semiconductor material can be in situ doped with a second dopant and/or subsequently implanted with the second dopant. The second mask can then be removed. It should be noted that the second epitaxial semiconductor material and the second dopant of the second FET (e.g., the PFET) will be different from that of the first epitaxial semiconductor material and the first dopant, respectively, of the first FET (e.g., the NFET).

A dopant activation anneal process can then be performed to activate the dopants (i.e., to activate first dopant in the first source/drain regions and the second dopant in the second source/drain regions). Following dopant activation, middle of the line (MOL) processing can be completed.

Also disclosed herein are integrated circuit (IC) structures having one or more field effect transistors (FETs) formed according to the methods described above. For example, the IC structures can include at least one FET. The FET can include a semiconductor body having a channel region. An interlayer dielectric (ILD) layer cover the semiconductor body and a gate can extend essentially vertically through the ILD layer to the semiconductor body at the channel region. The ILD layer can have openings and, particularly, metal plug openings, which are on opposing sides of the gate and which extend essentially vertically to the semiconductor body. The openings can further extend into the semiconductor body to create source/drain trenches, which are within the semiconductor body and aligned below the openings in the ILD layer such that, within the semiconductor body, the channel region is positioned laterally between source/drain trenches. The FET can further include source/drain regions. The source/drain regions can be made up of epitaxial semiconductor material, which overfills the source/drain trenches (i.e., which fills the source/drain trenches and further extends up into the openings within the ILD layer). The FET can further include metal plugs in the openings above the source/drain regions.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
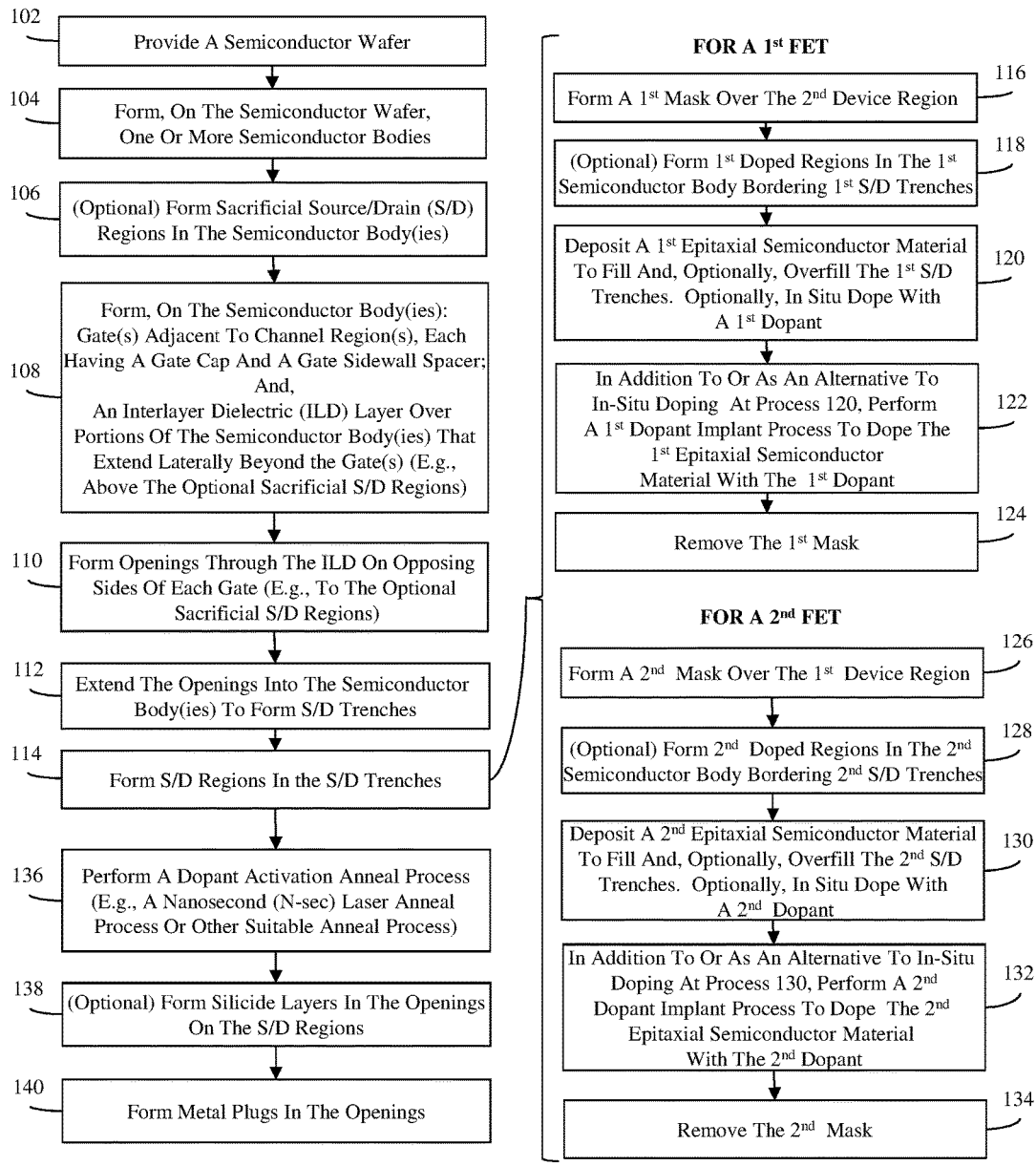
FIG. 1 is a flow diagram illustrating methods of forming one or more field effect transistors for an integrated circuit structure.

As mentioned above, as complementary metal oxide semiconductor (CMOS) technologies scale to smaller nodes, smaller critical dimensions can lead to problems that negatively impact device performance. For example, with field effect transistors (FETs), smaller critical dimensions can lead to an increase in parasitics and, particularly, an increase in parasitic resistances, such as metal plug resistance and source/drain region resistance. Additionally, smaller critical dimensions can lead to overlay errors when lithographically patterning openings for metal plugs that will contact source/drain regions. As a result of these overlay errors, the source/drain regions may be uncontacted or only partially contacted.

Additionally, in conventional field effect transistor (FET) processing, some processes (e.g., processes performed during replacement metal gate formation), which are performed after source/drain dopant activation and before middle of the line (MOL) processing, are associated with a high thermal budget. Such a high thermal budge can cause deactivation of the source/drain dopants in both PFETs and NFETs (particularly in NFETs). Deactivation of source/drain dopants increases source/drain resistance and the source/drain dopants are not reactivated during subsequent anneal processes. This same high thermal budget can reduce the strain imparted on the FET channel regions by the epitaxial semiconductor material grown within the source/drain trenches and, as a result, the benefits of strain engineering are minimized. Finally, this same high thermal budget can cause diffusion of the source/drain dopants and, thus, significantly limit the control a designer has over the extact locations of source/drain to channel region junctions within the FETs.

To avoid the above-described issues, the disclosed methods of forming FETs specifically form the FET source/drain regions during MOL processing. That is, instead of forming the source/drain (S/D) regions of each FET during front end of the line (FEOL) processing, the S/D regions are formed during middle of the line (MOL) processing and, particularly, through metal plug openings in an interlayer dielectric (ILD) layer. Processes used to form the S/D regions through the metal plug openings include S/D trench formation, epitaxial semiconductor material deposition, S/D dopant implantation and S/D dopant activation (e.g., using an anneal process, such as a nanosecond laser anneal or other suitable anneal process). These processes can be immediately followed by silicide and metal plug formation. Since the post-MOL processing thermal budget is relatively low, the methods ensure reduced S/D dopant deactivation, reduced S/D strain reduction, and reduced S/D dopant diffusion and, as a result, enable reduced S/D resistance, optimal strain engineering, and flexible junction control, respectively. As an added benefit, since the S/D regions are formed through the metal plug openings, the methods eliminate the possibility of overlay errors that can lead to uncontacted or only partially contacted S/D regions.

More particularly, referring to the flow diagram of FIG. 1, disclosed herein are methods of forming one or more field effect transistors (FETs) for an integrated circuit (IC) structure. For purposes of illustration, the methods are described in greater detail below with respect to forming two FETs including a first FET having a first type conductivity (e.g., an N-type FET (NFET)) and a second FET having a second type conductivity that is different from the first type conductivity (e.g., a P-type FET (PFET)). Each FET that is formed according to the disclosed methods can be a non-planar FET such as a fin-type FET (finFET), as shown, or a tri-gate FET. Alternatively, each FET that is formed according to the disclosed methods can be a planar FET. For purposes of illustration, the methods are described in greater detail below with respect to forming finFETs. However, it should be understood that the description of the methods and the figures are not intended to be limiting. That is, the methods could be applied to form one or more FETs having the first type conductivity (e.g., one or more NFETs) in a first device region and/or one or more FETs having the second type conductivity (e.g., one or more PFETs) in a second device region. Additionally, the FET(s) can be either non-planar or planar FET(s).

Figure 2:
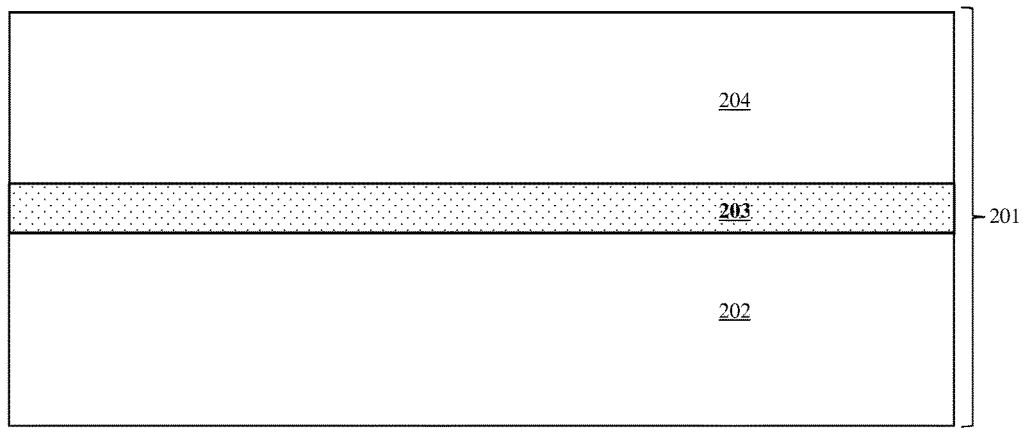
FIG. 2 is a cross-section diagram illustrating a partially completed structure formed according to the flow diagram of FIG. 1.

In any case, an embodiment of a method disclosed herein can include providing a semiconductor wafer 201 (102, see FIG. 2). The semiconductor wafer 201 can be a semiconductor-on-insulator wafer (e.g., a silicon-on-insulator (SOI) wafer) (as illustrated). That is, the semiconductor wafer 201 can include a substrate 202 (e.g., a silicon substrate or other suitable handler substrate), an insulator layer 203 (e.g., a buried oxide (BOX) layer) on the substrate 202 and a semiconductor layer 204 (e.g., a silicon layer or other suitable semiconductor layer) on the insulator layer 203. Alternatively, the semiconductor wafer 201 can be a bulk semiconductor wafer (e.g., a bulk silicon wafer or some other suitable bulk semiconductor wafer).

Figure 3A:
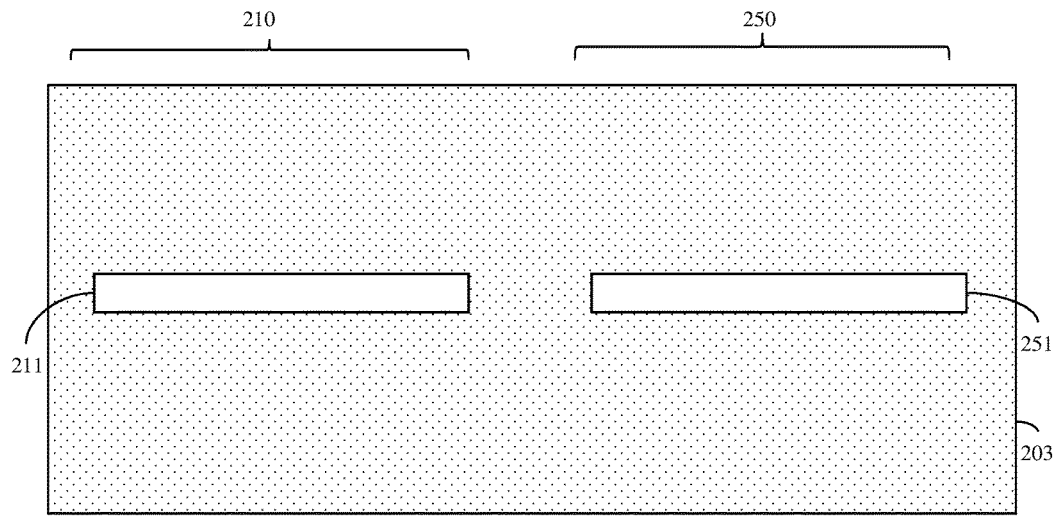
FIGS. 3A and 3B are top view and cross-section diagrams, respectively, illustrating a partially completed structure formed according to the flow diagram of FIG. 1.
Figure 3B:
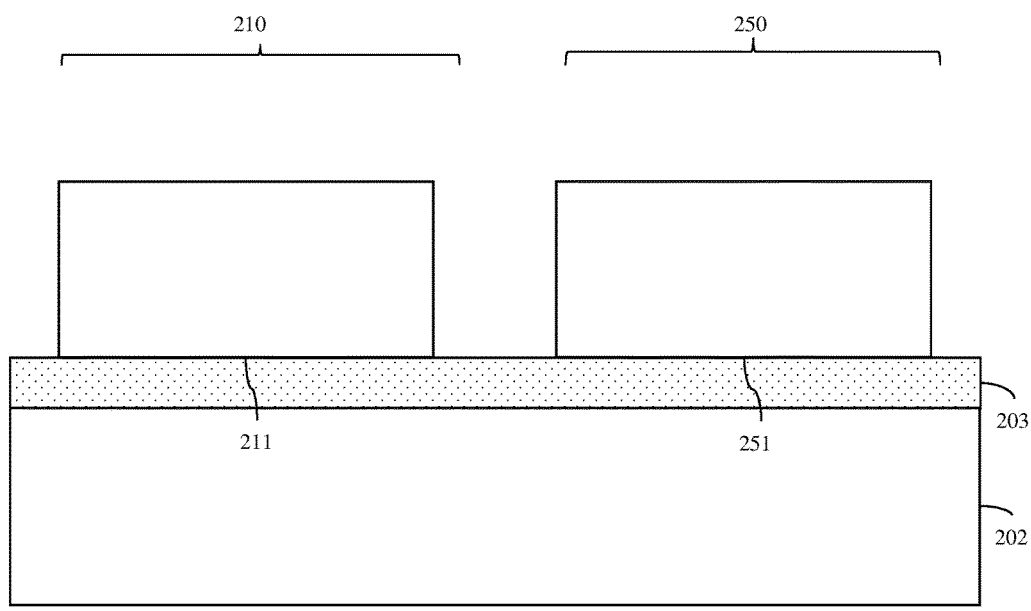

One or more semiconductor bodies (e.g., silicon bodies) can be formed on the semiconductor wafer 201 (104, see FIGS. 3A and 3B). For example, a first semiconductor body 211 for a first FET 210 can be formed in a first device region and a second semiconductor body 251 for a second FET 250 can be formed in a second device region. The first semiconductor body 211 and the second semiconductor body 251 can be formed, for example, using the semiconductor layer of a semiconductor-on-insulator wafer (e.g., using the silicon layer of an SOI wafer) such that the semiconductor bodies (e.g., silicon bodies) are electrically isolated from the substrate 202 by the insulator layer 203, as illustrated. Alternatively, the first semiconductor body 211 and the second semiconductor body 251 can be formed using an upper portion of a bulk semiconductor substrate (e.g., a bulk silicon substrate), which is electrically isolated from a lower portion of the semiconductor substrate (e.g., by one or more well regions, one or more trench isolation regions, etc.). For finFETs (or trigate FETs), the first semiconductor body 211 and the second semiconductor body 251 can be fin-shaped semiconductor bodies (i.e., relatively thin, essentially rectangular semiconductor bodies, also referred to herein as semiconductor fins). Techniques for forming fin-shaped semiconductor bodies (e.g., lithographic patterning techniques or sidewall image transfer techniques) are well known in the art and, thus, the details have been omitted from this specification in order to allow the reader to focus on the salient aspects of the disclosed method.

It should be noted that the first semiconductor body 211 and the second semiconductor body 251 can, by design, each have areas designated for source/drain regions and for a channel region to be positioned laterally between the source/drain regions. The first semiconductor body 211 and the second semiconductor body 251 can each be appropriately doped (e.g., using multiple masked dopant implantation processes) either before or after formation so that the first channel region 213 of the first FET 210 and the second channel region 253 of the second FET 250 will have the desired conductivity types and levels. For example, the second semiconductor body 251, which will be used to form the second FET 250 (e.g., the PFET) can be doped with a first dopant so as to have the first type conductivity at a relatively low conductivity level (e.g., N− conductivity); whereas, the first semiconductor body 211, which will be used to form the first FET 210 (e.g., the NFET) can be doped with a second dopant so as to have the second type conductivity at a relatively low conductivity level (e.g., P− conductivity). Alternatively, the semiconductor bodies 211, 251 can remain undoped.

After the first semiconductor body 211 and the second semiconductor body 251 are formed and doped (if applicable), the following can be formed: optional first sacrificial source/drain regions 212 in the first semiconductor body 211 on opposing sides of the first channel region 213 and/or optional second sacrificial source/drain regions 252 in the second semiconductor body 251 on opposing sides of the second channel region 253; a first gate 217 adjacent to the first semiconductor body 211 at the first channel region 213 and a second gate 257 adjacent to the second semiconductor body 251 at the second channel region 253, wherein each gate has a gate cap and a gate sidewall spacer; and an interlayer dielectric (ILD) layer 280, wherein the ILD layer 280 covers portions 214, 254 of the first semiconductor body 211 and the second semiconductor body 251 that extend laterally beyond the first gate 217 and the second gate 257, respectively (e.g., wherein the ILD layer 280 covers the optional first sacrificial source/drain regions 212 and the optional second sacrificial source/drain regions 252, if present) (106-108).

The processes 106-108 are described in greater detail below and illustrated in the figures with respect to the formation of replacement metal gate (RMG) structures using RMG formation techniques. However, it should be understood that the description and the figures are not intended to be limiting and that, alternatively, gate first structures (e.g., each with a silicon dioxide gate dielectric layer and a doped polysilicon gate conductor layer) could be formed processes 106-108 using gate first formation techniques.

Figure 4A:
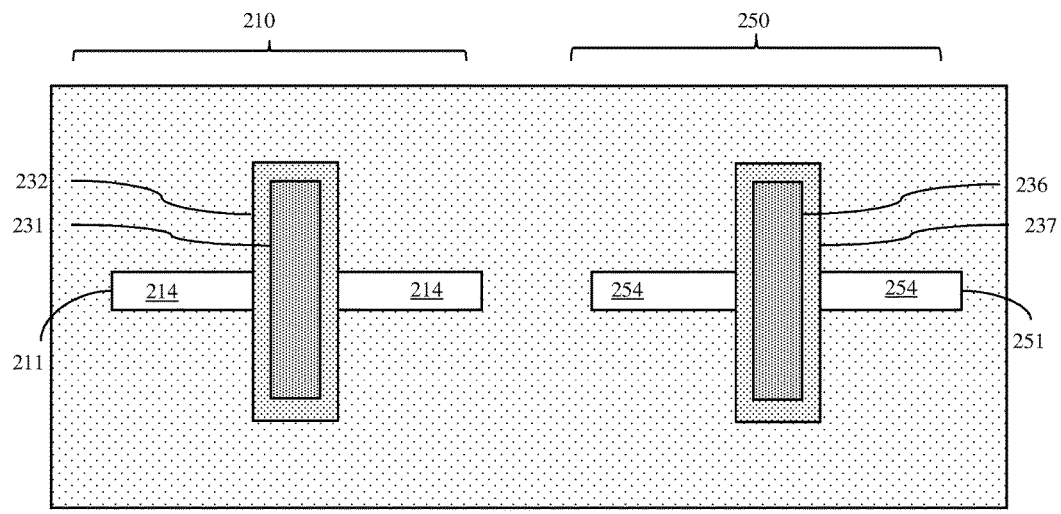
FIGS. 4A and 4B are top view and cross-section diagrams, respectively, illustrating a partially completed structure formed according to the flow diagram of FIG. 1.
Figure 4B:
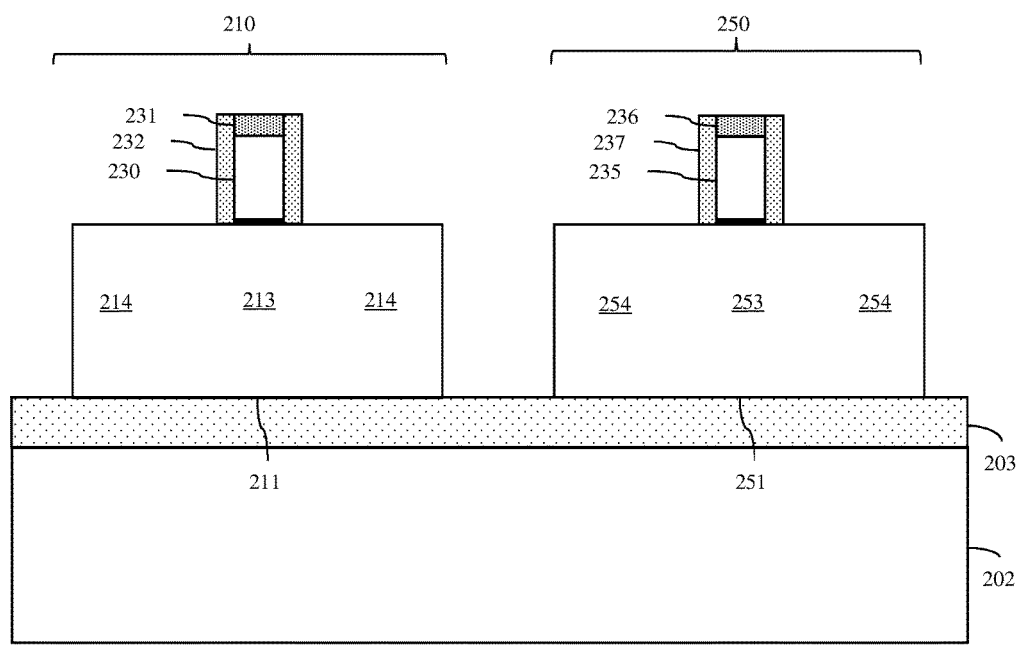

For example, at process 106-108, a first sacrificial gate 230, having a sacrificial gate cap 231 and a first gate sidewall spacer 232, can be formed adjacent to the first semiconductor body 211 at the first channel region 213 and a second sacrificial gate 235, having a sacrificial gate cap 236 and a second gate sidewall spacer 237, can be formed adjacent to the second semiconductor body 251 at the second channel region 253 (see FIGS. 4A-4B). For example, one or more first sacrificial layers (e.g., a conformal silicon dioxide layer and a blanket polysilicon layer) can be formed over the semiconductor bodies and a second sacrificial layer (e.g., a silicon nitride layer or other suitable dielectric cap layer), which is different from the first sacrificial layer, can be formed on the first sacrificial layer. The first and second sacrificial layers can be patterned and etched to form the first sacrificial gate 230 and the second sacrificial gate 235 with the respective sacrificial gate caps 231 and 236. In the case of a non-planar FET, it should be understood that the sacrificial gates will be immediately adjacent to the opposing sidewalls of the semiconductor bodies at the channel regions and will further extend over the top surfaces of the semiconductor bodies at the channel regions. The first gate sidewall spacer 232 and the second gate sidewall spacer 237 can be formed on the first sacrificial gate 230 and the second sacrificial gate 235, respectively, using conventional sidewall spacer formation techniques. That is, one or more relatively thin conformal dielectric spacer layers can be deposited over the partially completed structure. The dielectric spacer layer(s) can include layer(s) of silicon nitride, silicon carbon nitride, silicon boron carbon nitride, silicon oxycarbide or other suitable dielectric spacer material. In any case, a directional etch process can then be performed so as to remove the dielectric spacer material from horizontal surfaces, thereby forming the first gate sidewall spacer 232 on the sidewalls of the first sacrificial gate 230 and the second gate sidewall spacer 237 on the sidewalls of the second sacrificial gate 235.

Figure 5:
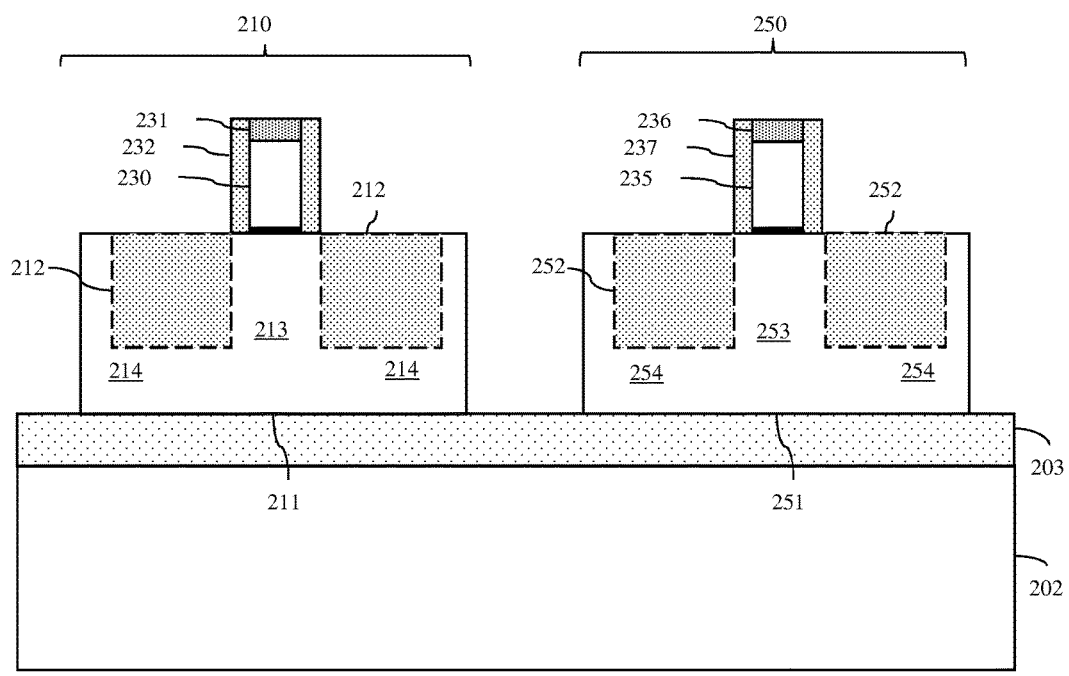
FIGS. 5-20 are cross-section diagrams illustrating partially completed structures formed according to the flow diagram of FIG. 1.

Optionally, after the gate sidewall spacers are formed, first sacrificial source/drain regions 212 can be formed within the first semiconductor body 211 and/or second sacrificial source/drain regions 252 can be formed within the second semiconductor body 251 (see FIG. 5). Specifically, source/drain trenches can be formed (e.g., lithographically patterned and etch) in the semiconductor bodies. That is, during the same patterning and etch processes, first source/drain trenches can be formed in the portions 214 of the first semiconductor body 211 that extend laterally beyond the first sacrificial gate 230 (i.e., in the areas designated for the first source/drain regions on opposing sides of the first channel region 213) and second source/drain trenches can also be formed in the portions 254 of the second semiconductor body 251 that extend laterally beyond the second sacrificial gate 235 (i.e., in the areas designated for the second source/drain regions on opposing sides of the second channel region 253). All of the source/drain trenches can then be filled with a sacrificial material that is different from the semiconductor material of the semiconductor bodies 211, 251 so that, during subsequent processing as discussed in greater detail below, the sacrificial material can be selectively removed from the source/drain trenches. The sacrificial material can, for example, be epitaxial silicon germanium, epitaxial germanium or any other suitable sacrificial material that can be selectively etched over the semiconductor material of the semiconductor bodies.

Figure 6:
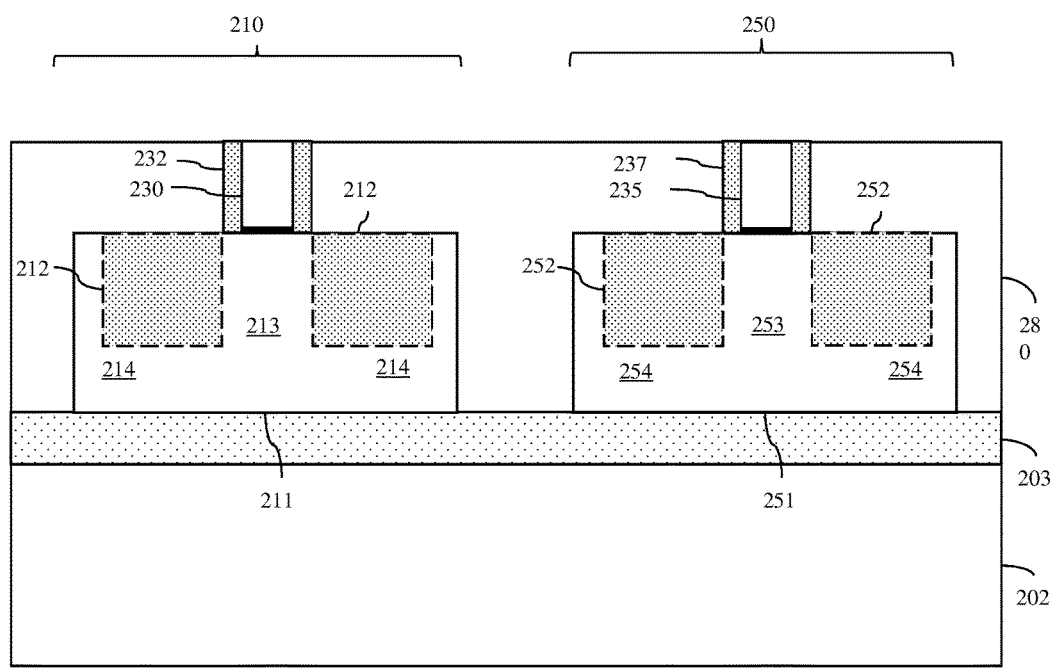

An interlayer dielectric (ILD) layer 280 can be formed over the partially completed structure (see FIG. 6). Specifically, a blanket ILD layer 280 can be deposited so as to cover the first sacrificial gate cap 231 and first gate sidewall spacer 232 of the first sacrificial gate 230 on the first semiconductor body 211, so as to cover the portions 214 of the first semiconductor body 211 that extend laterally beyond the first sacrificial gate 230 (e.g., to cover the optional first sacrificial source/drain regions 212, if present), so as to cover the second sacrificial gate cap 236 and second gate sidewall spacer 237 of the second sacrificial gate 235 on the second semiconductor body 251, and so as to cover the portions 254 of the second semiconductor body 251 that extend laterally beyond the second sacrificial gate 235 (e.g., to cover the optional second sacrificial source/drain regions 252, if present). The ILD layer 280 can be a silicon dioxide ILD layer. Alternatively, the ILD layer 280 can be made of any other suitable ILD material (e.g., borophosphosilicate glass (BPSG), tetraethyl orthosilicate (TEOS), fluorinated tetraethyl orthosilicate (FTEOS), etc.). After the ILD layer 280 is deposited, a polishing process (e.g., a chemical mechanical polishing (CMP) process) can be performed in order to remove the sacrificial gate caps 231, 236, thereby exposing the top surfaces of the first sacrificial gate 230 and the second sacrificial gate 235.

Figure 7:
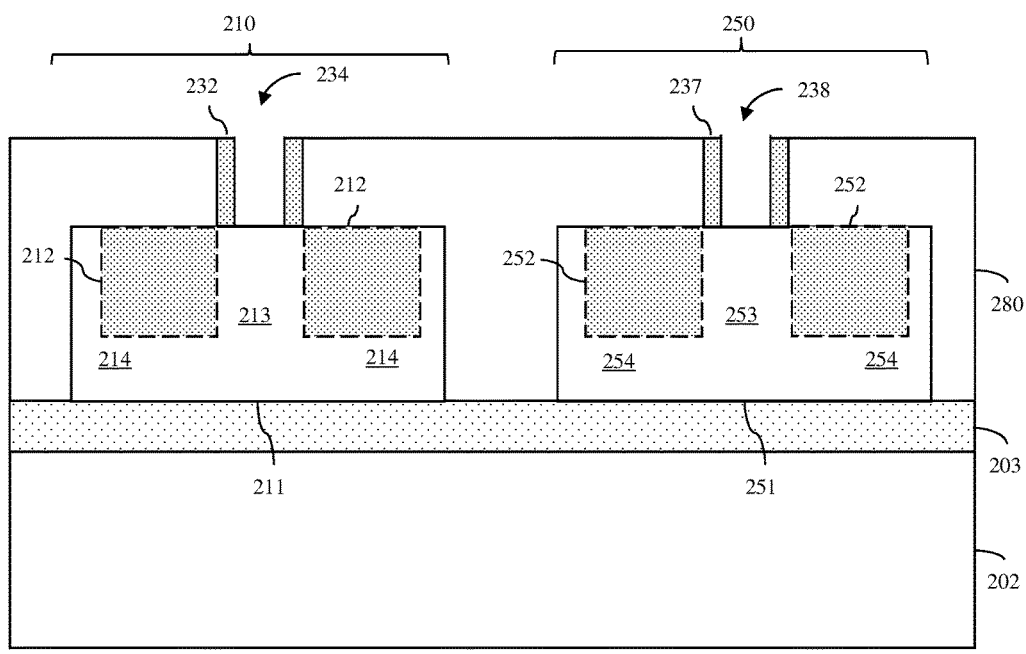

A selective etch process can then be performed in order to selectively remove the first sacrificial gate 230 and the second sacrificial gate 235, thereby creating a first gate opening 234 adjacent to the first channel region 213 of the first semiconductor body 211 and a second gate opening 238 adjacent to the second channel region 253 of the second semiconductor body 251 (see FIG. 7). Specifically, the sacrificial materials of the sacrificial gates can be selectively etched over the dielectric material used for the gate sidewall spacers 232, 237 and the ILD layer 280 such that, following removal of the sacrificial gates, the first gate opening 234 remains lined with the first gate sidewall spacer 232 and the second gate opening 238 remains lined with the second gate sidewall spacer 237.

Figure 8:
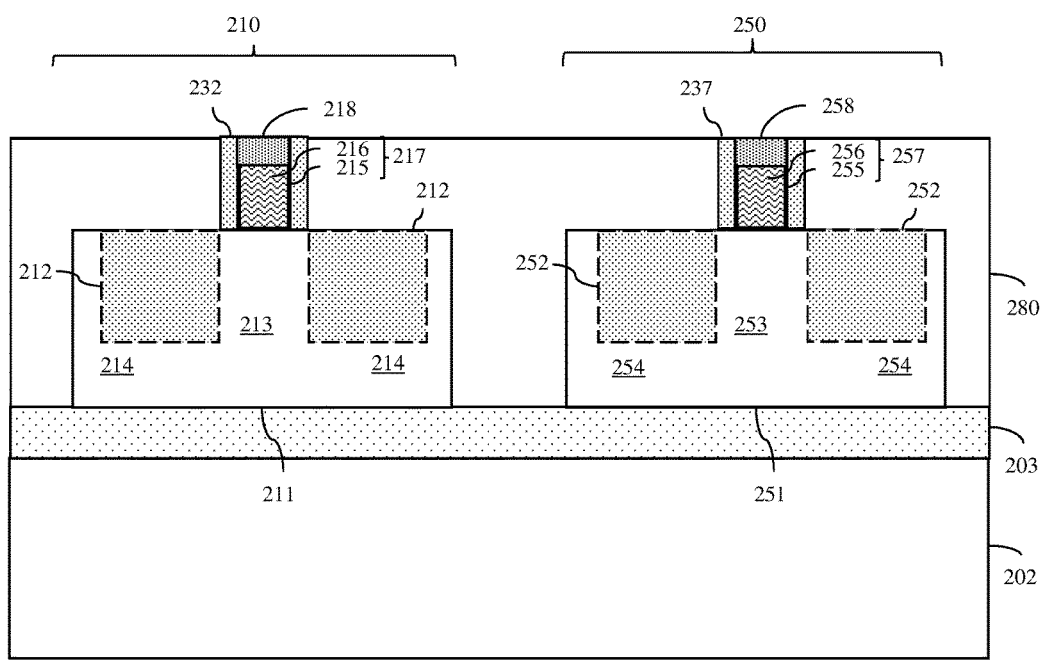

Subsequently, replacement metal gates 217, 257 can be formed within the gate openings 234, 238, respectively (see FIG. 8). Those skilled in the art will recognize that the materials used for a replacement metal gate on an NFET will typically be different than the materials used for a replacement metal gate on a PFET. Since in this embodiment, the first FET and second FET are to be an NFET and a PFET, respectively, discrete processes will be used to form a first replacement metal gate 217 for the first FET 210 and the second replacement metal gate 257 for the second FET. Specifically, the second device region can be masked and a first replacement metal gate 217, having a first gate cap 218, can be formed within the first gate opening 234 adjacent to the first channel region 213 (e.g., above the top surface and positioned laterally adjacent to the opposing sides of the first semiconductor body 211 at the first channel region 213) and also adjacent to the first gate sidewall spacer 232. For example, a conformal first high-K gate dielectric layer 215 can be deposited so as to line the first gate opening 234 and one or more first gate conductor layers 216 (e.g., first gate metal layer(s)) can be deposited onto the first gate dielectric layer 215 to form the first replacement metal gate 217. Before or after forming the first replacement metal gate 217, the first device region can be masked and a second replacement metal gate 257, having a second gate cap 258, can be formed within the second gate opening 238 adjacent to the second channel region 253 (e.g., above the top surface and positioned laterally adjacent to the opposing sides of the second semiconductor body 251 at the second channel region 253) and also adjacent to the second gate sidewall spacer 237. For example, a conformal second high-K gate dielectric layer 255 can be deposited so as to line the second gate opening 238 and one or more second gate conductor layers 256 (e.g., second gate metal layer(s)) can be deposited onto the second gate dielectric layer 255 to form the second replacement metal gate 257.

Those skilled in the art will recognize that the materials and thicknesses of the dielectric and metal layers used for the replacement metal gates can be preselected to achieve desired work functions given the conductivity type of the FETs. Exemplary high-K dielectric materials include, but are not limited to, hafnium (HO-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The optimal work function for a gate conductor of an NFET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal work function for a gate conductor of a PFET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Exemplary fill metals include, but are not limited to, tungsten and aluminum.

Subsequently, a polishing process (e.g., a CMP process) can be performed to remove the replacement metal gate materials from above the top surface of the ILD layer 280. Such a polishing process can further be used to adjust the height of the replacement metal gates, as necessary. As a result of this polishing process, the top surfaces the ILD layer 280, the gate sidewall spacers 232, 237 and the replacement metal gates 217, 257 will be approximately level. The first replacement metal gate 217 and the second replacement metal gate 257 can subsequently be recessed (i.e., selectively etched back), a dielectric cap layer (e.g., a silicon nitride layer or other suitable dielectric cap layer) can be deposited and a polishing process (e.g., a CMP process) can be performed in order to remove the dielectric cap layer from above the top surface of the ILD layer 280, thereby forming a first gate cap 218 on the first replacement metal gate 217 and a second gate cap 258 on the second replacement metal gate 257.

In conventional processing, the source/drain regions of any field effect transistors would have already been formed at this point and middle of the line (MOL) processing would begin. MOL processing generally involves the formation of metal plugs in the ILD layer above the source/drain regions (also referred to as TS contacts) followed by the formation of an additional interlayer dielectric (ILD) layer over the ILD layer gates and metal plugs, the formation of gate contacts (also referred to as CB contacts) (i.e., contacts that extend through the additional ILD layer to the gates) and the formation of source/drain contacts (also referred to as CA contacts) (i.e., contacts that extend through the additional ILD layer to the metal plugs). However, in the present methods, the source/drain regions have yet to be formed.

Figure 9:
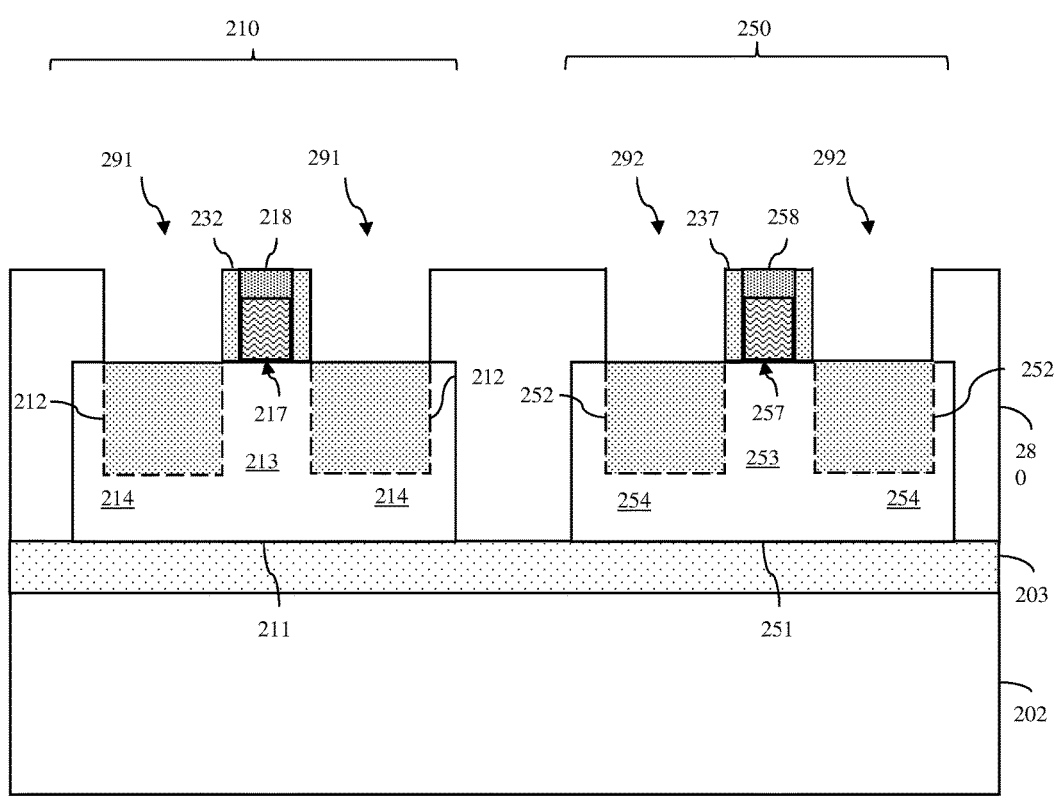

Thus, to complete the first FET 210 and the second FET 250, openings and, particularly, metal plug openings (also referred to as TS openings) can be formed in the ILD layer 280 (110, see FIG. 9). Specifically, the same lithographic patterning and etch processes can be used to form first openings 291, which extend essentially vertically from the top surface of the ILD layer 280 to the top surface of the first semiconductor body 211 (e.g., to the first sacrificial source/drain regions 212, if present) and which are in any case positioned adjacent to opposing sides of the first gate 217, and to also form second openings 292, which extend essentially vertically from the top surface of the ILD layer 280 to the top surface of the second semiconductor body 251 (e.g., to the second sacrificial source/drain regions 252, if present) and which are in any case positioned adjacent to opposing sides of the second gate 257.

Figure 10:
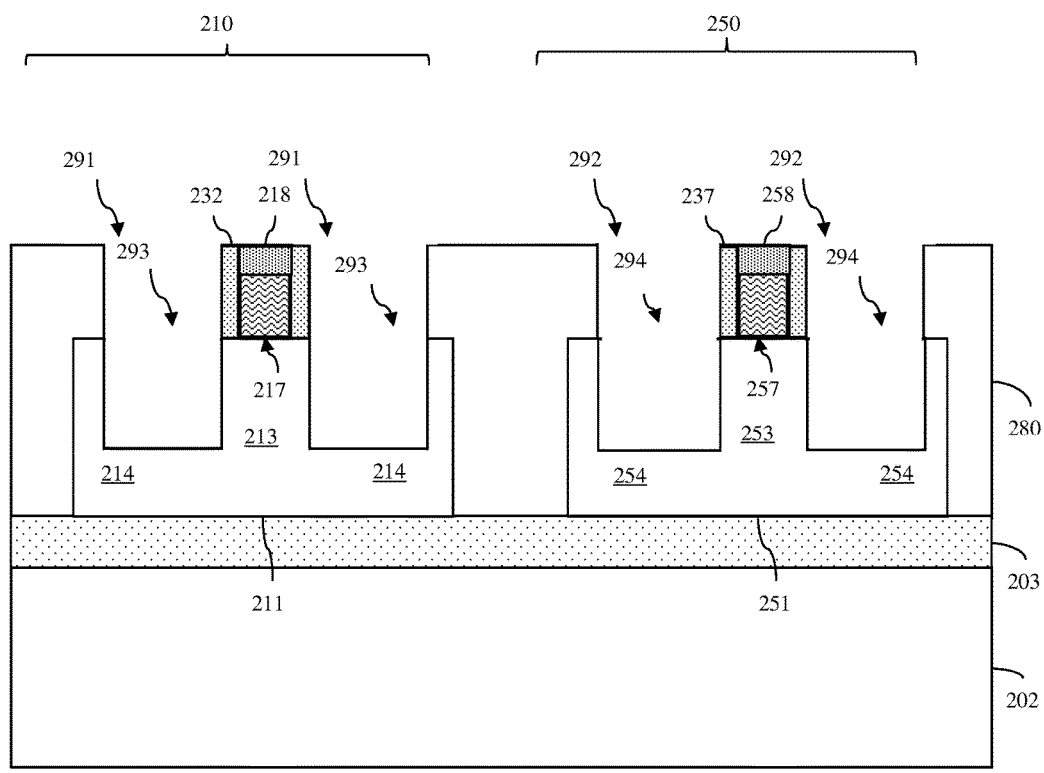

Next, instead of immediately forming metal plugs in the metal plug openings 291, 292, an etch process can be performed to further extend the first openings 291 into the first semiconductor body 211 and the second openings 292 into the second semiconductor body 251, thereby forming first source/drain trenches 293 in the first semiconductor body 211 on opposing sides of the first channel region 213 and second source/drain trenches 294 in the second semiconductor body 251 on opposing sides of the second channel region 253 (112, see FIG. 10). It should be noted that, in the absence of the sacrificial source/drain regions 212, 252, this etch process 112 can be an anisotropic etch process (e.g., a reactive ion etch process) that etches the semiconductor material of the semiconductor bodies at a significantly faster rate in the direction perpendicular to their bottom surface as compared to the direction parallel to their bottom surface. However, if the sacrificial source/drain regions 212, 252 are present, this etch process 112 can be an etch process that etches the sacrificial material of the sacrificial source/drain regions selective to the semiconductor material of the semiconductor bodies, thereby removing the sacrificial material and exposing the surfaces of the previously etched source/drain trenches.

Figure 11:
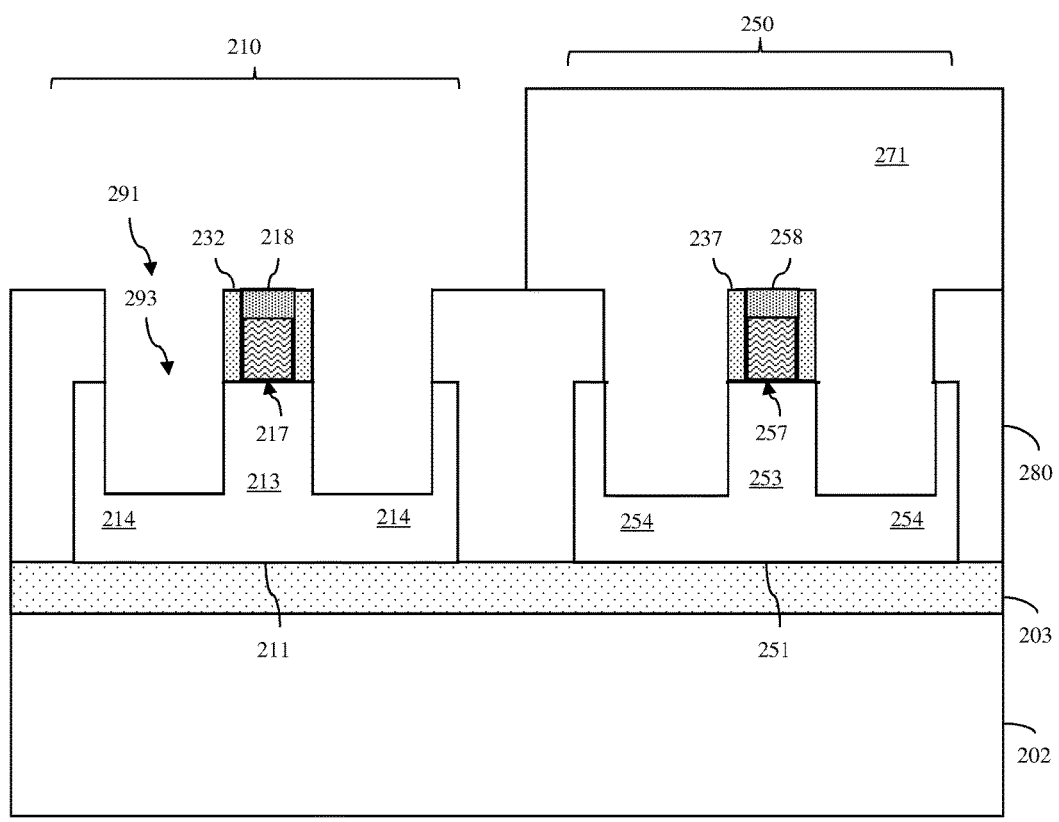
Figure 12:
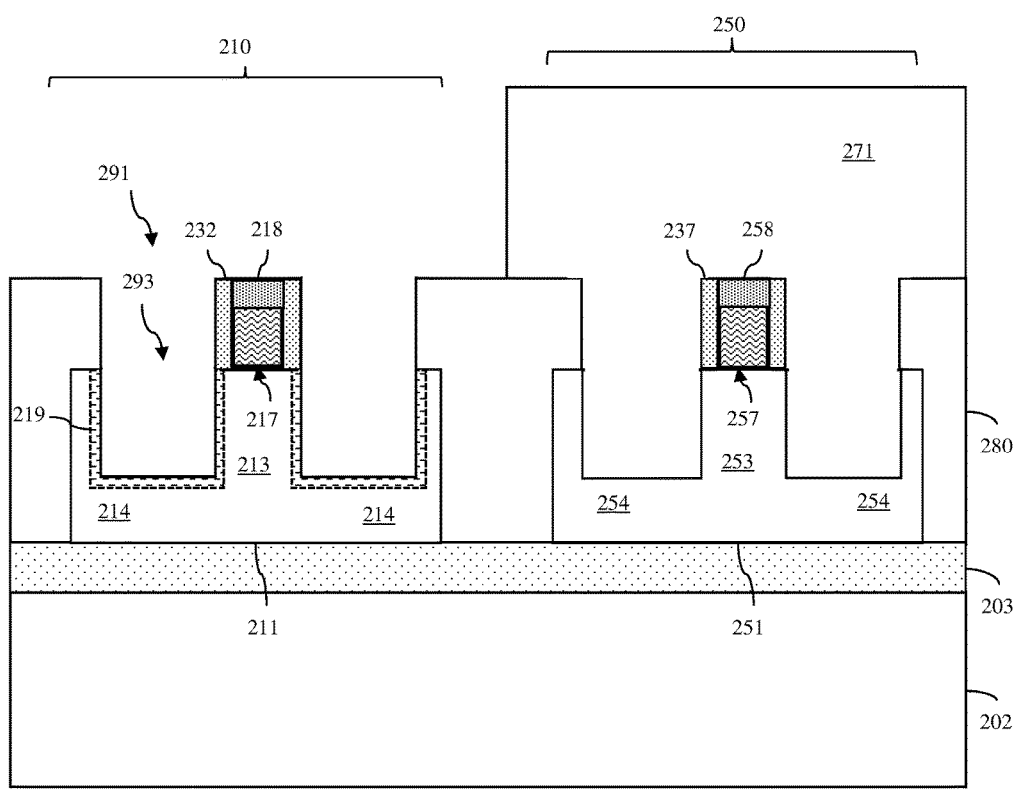
Figure 13:
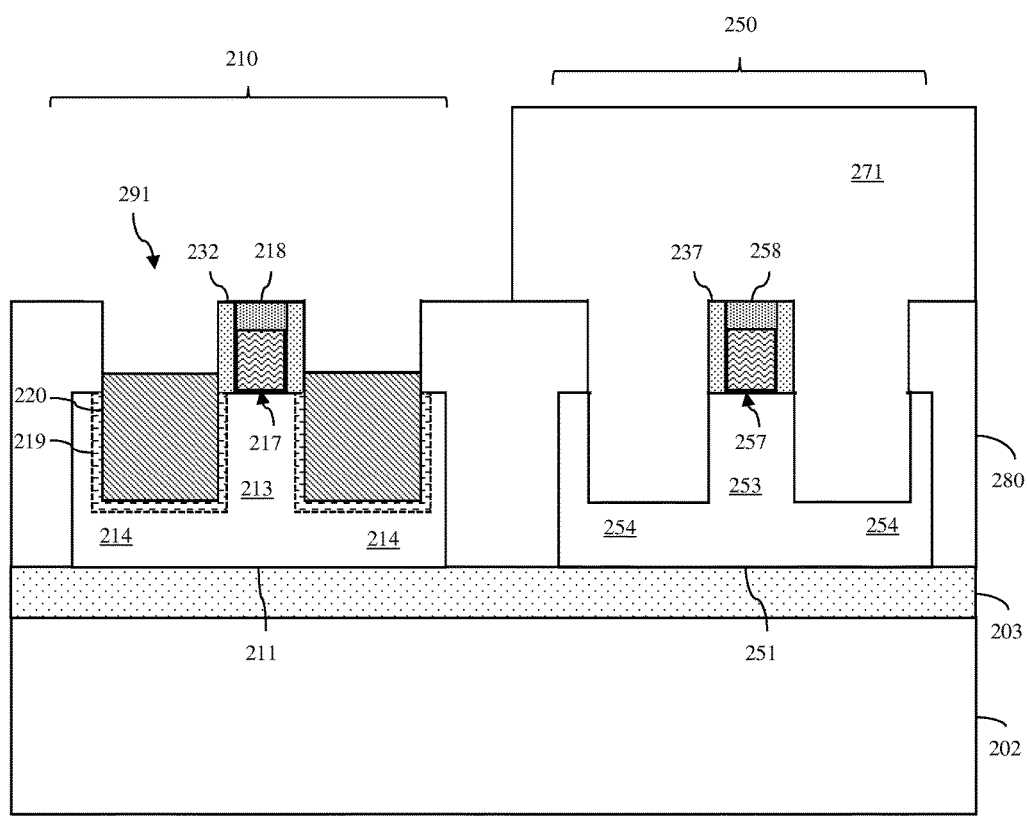
Figure 14:
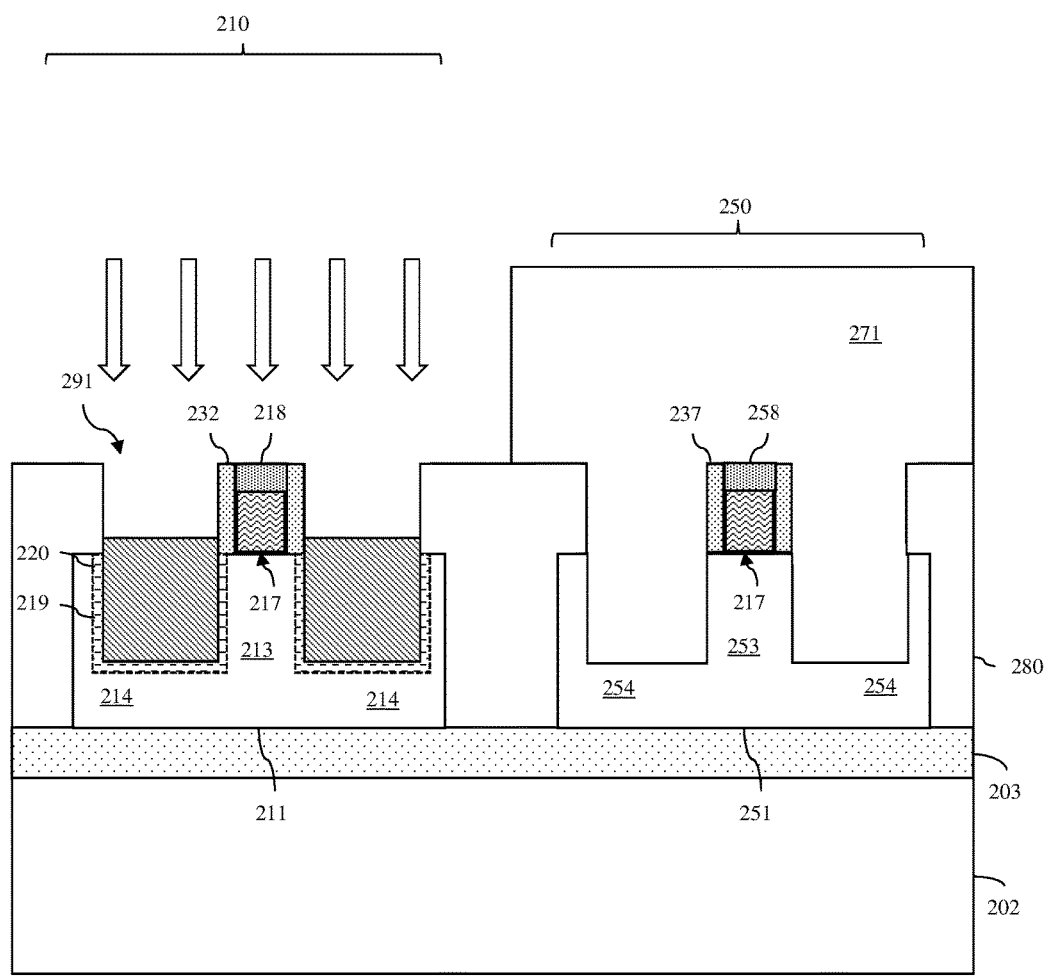

Following formation of the first source/drain trenches 293 and the second source/drain trenches 294, additional processing can be performed through the first openings 291 and second openings 292 to complete the first source/drain regions for the first FET 210 and the second source/drain regions for the second FET 250 (114). For example, a first mask 271 can be formed over the second device region (which contains the second semiconductor body 251 for the second FET 250) (116, see FIG. 11). Processing can then be performed in order to form the first source/drain regions for the first FET 210. That is, optionally, first doped regions 219 can be formed within the first semiconductor body 211 bordering the first source/drain trenches 293 (118, see FIG. 12). For example, a dopant implantation process can be used to implant a first dopant into the area of the first semiconductor body 211 bordering the first source/drain trenches 293. The first dopant can be selected so that the resulting first doped regions 219 have the first type conductivity. Next, a first epitaxial semiconductor material can be deposited into the first source/drain trenches 293 to form the first source/drain regions 220, wherein the first channel region 213 is positioned laterally between the first source/drain regions 220 (120, see FIG. 13). The first epitaxial semiconductor material can be deposited so as to at least fill the first source/drain trenches 293 and, optionally, so as to overfill the first source/drain trenches 293 such that the first epitaxial semiconductor material of the first source/drain regions 220 extends upward above the level of the top surface of the first semiconductor body 211 and into the first openings 291 within the ILD layer 280. The first epitaxial semiconductor material can be in situ doped with the first dopant and/or subsequently implanted with the first dopant (e.g., using an ion implantation process) so that the resulting first source/drain regions 220 have the first type conductivity at a relatively high conductivity level (122, see FIG. 14). For example, if the first FET 210 is to be an NFET, the first epitaxial semiconductor material can be carbon-doped silicon or some other epitaxially deposited semiconductor material preselected to impart tensile strain on the channel region 213 for optimal NFET performance. Additionally, the first dopant can be preselected and the doping process (e.g., the in situ doping process and/or the ion implantation process) can be performed, as discussed in greater detail below, so that the first source/drain regions 220 have N-type conductivity at a relatively high conductivity level (i.e., N+ conductivity). The first mask 271 can then be removed (124).

Figure 15:
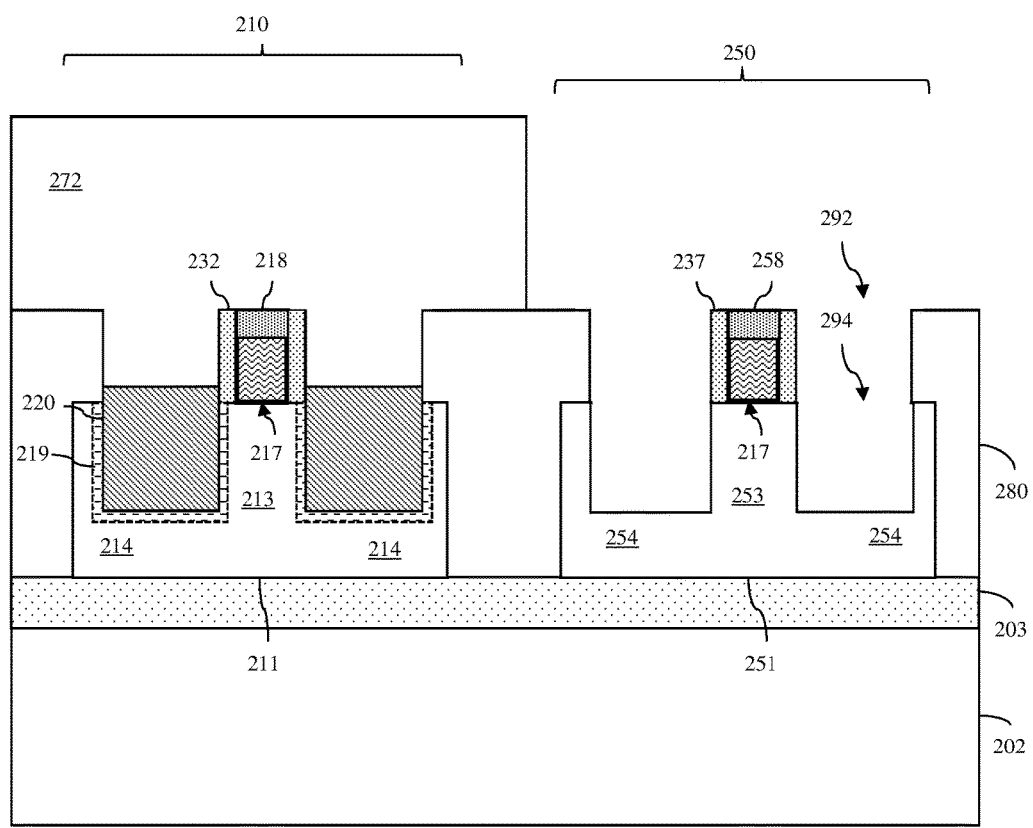
Figure 16:
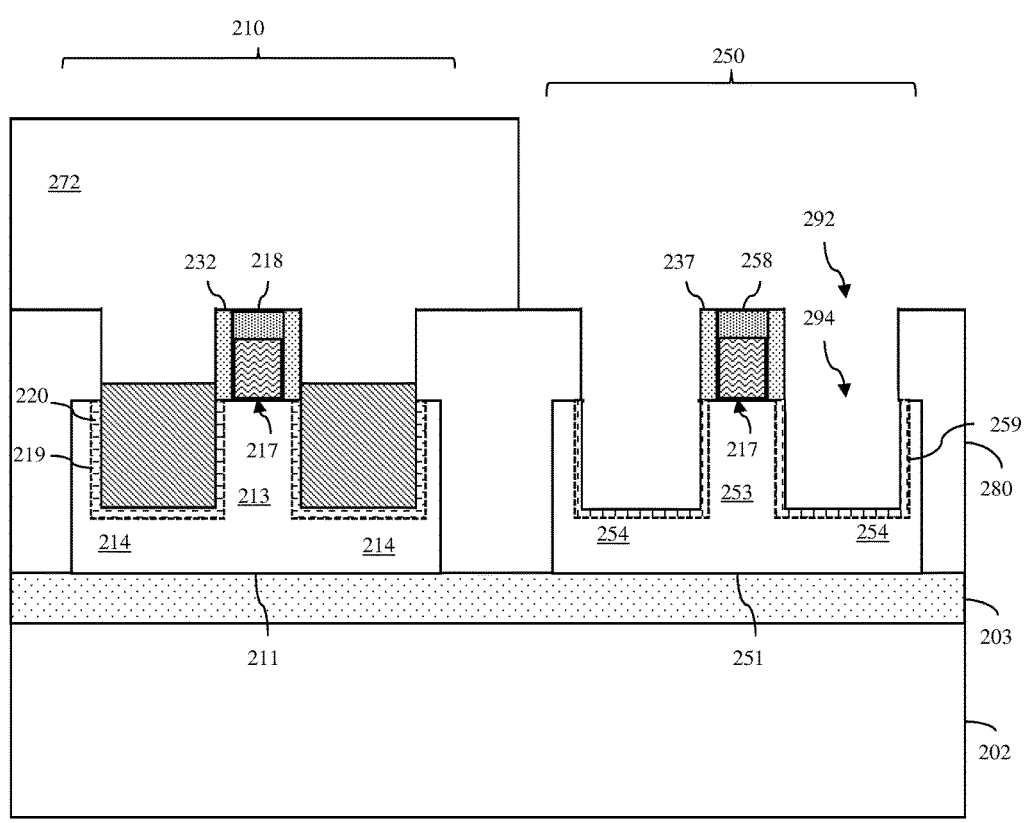
Figure 17:
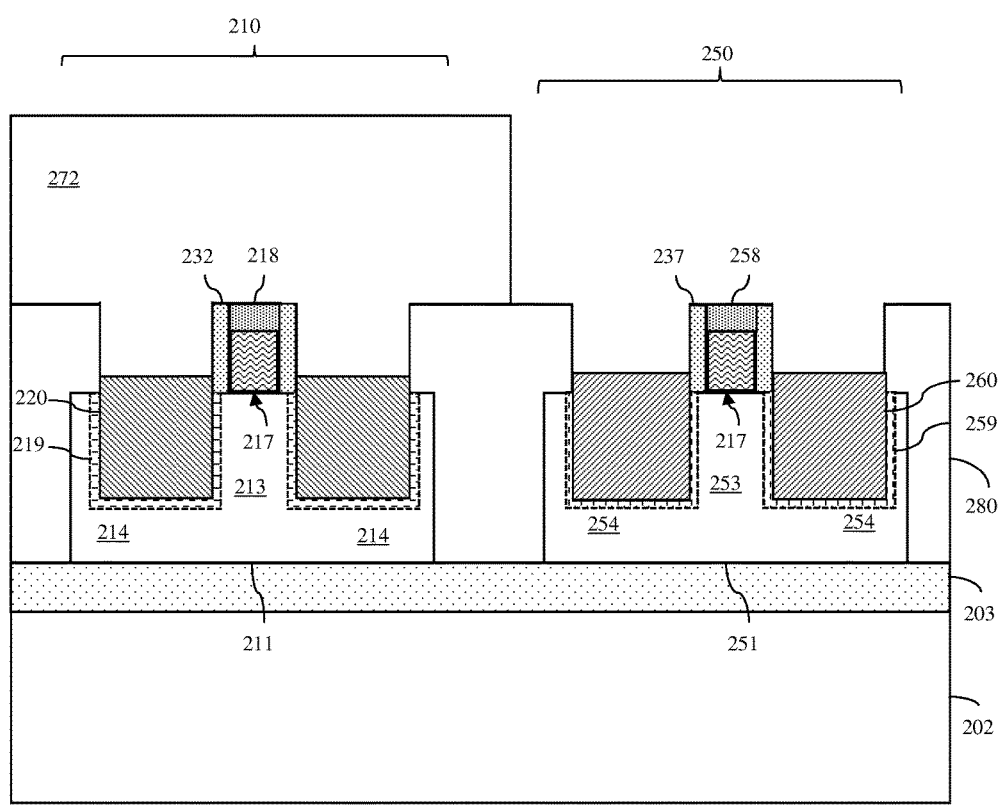
Figure 18:
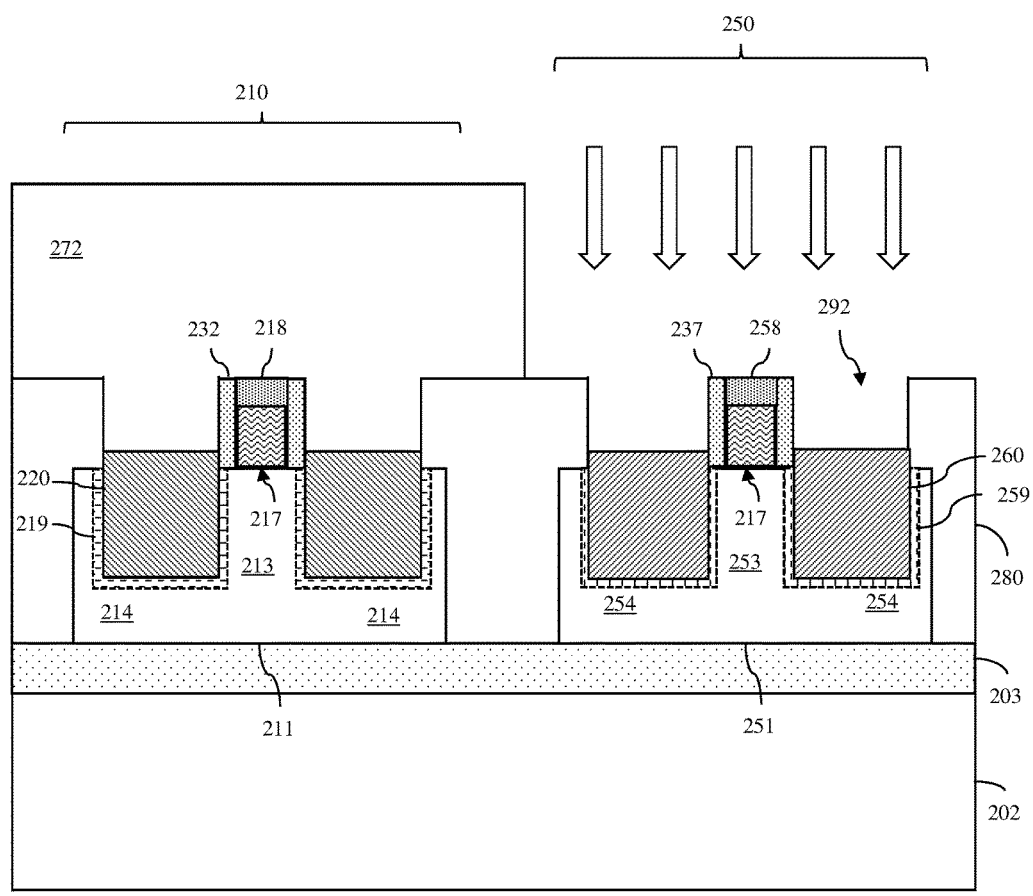

Additionally, before or after the first source/drain regions 220 for the first FET 210 are formed in the first source/drain trenches 293, a second mask 272 can be formed over the first device region (which contains the first semiconductor body 211 for the first FET 210) (126, see FIG. 15). Processing can then be performed in order to form the second source/drain regions for the first FET 250. That is, optionally, second doped regions 259 can be formed within the second semiconductor body 251 bordering the second source/drain trenches 294 (128, see FIG. 16). For example, a dopant implantation process can be used to implant a second dopant into the area of the second semiconductor body 251 bordering the second source/drain trenches 294. The second dopant can be selected so that the resulting second doped regions 259 have the second type conductivity. Next, a second epitaxial semiconductor material can be deposited into the second source/drain trenches 294 to form the second source/drain regions 260, wherein the second channel region 253 is positioned laterally between the second source/drain regions 260 (130, see FIG. 17). The second epitaxial semiconductor material can be deposited so as to at least fill the second source/drain trenches 294 and, optionally, so as to overfill the second source/drain trenches 294 such that the second epitaxial semiconductor material of the second source/drain regions 260 extends upward above the level of the top surface of the second semiconductor body 251 and into the second openings 292 within the ILD layer 280. The second epitaxial semiconductor material can be in situ doped with the second dopant and/or subsequently implanted with the second dopant (e.g., using an ion implantation process) so that the resulting second source/drain regions 260 have the second type conductivity at a relatively high conductivity level (132, see FIG. 18). For example, if the second FET 250 is to be a PFET, the second epitaxial semiconductor material can be germanium, silicon germanium or some other semiconductor material preselected to impart compressive strain on the channel region 253 for optimal PFET performance. Additionally, the second dopant can be preselected and the doping process (e.g., the in situ doping process and/or the ion implantation process) can be performed, as discussed in greater detail below, so that the second source/drain regions 260 have P-type conductivity at a relatively high conductivity level (i.e., P+ conductivity). The second mask 272 can then be removed (134).

Figure 19:
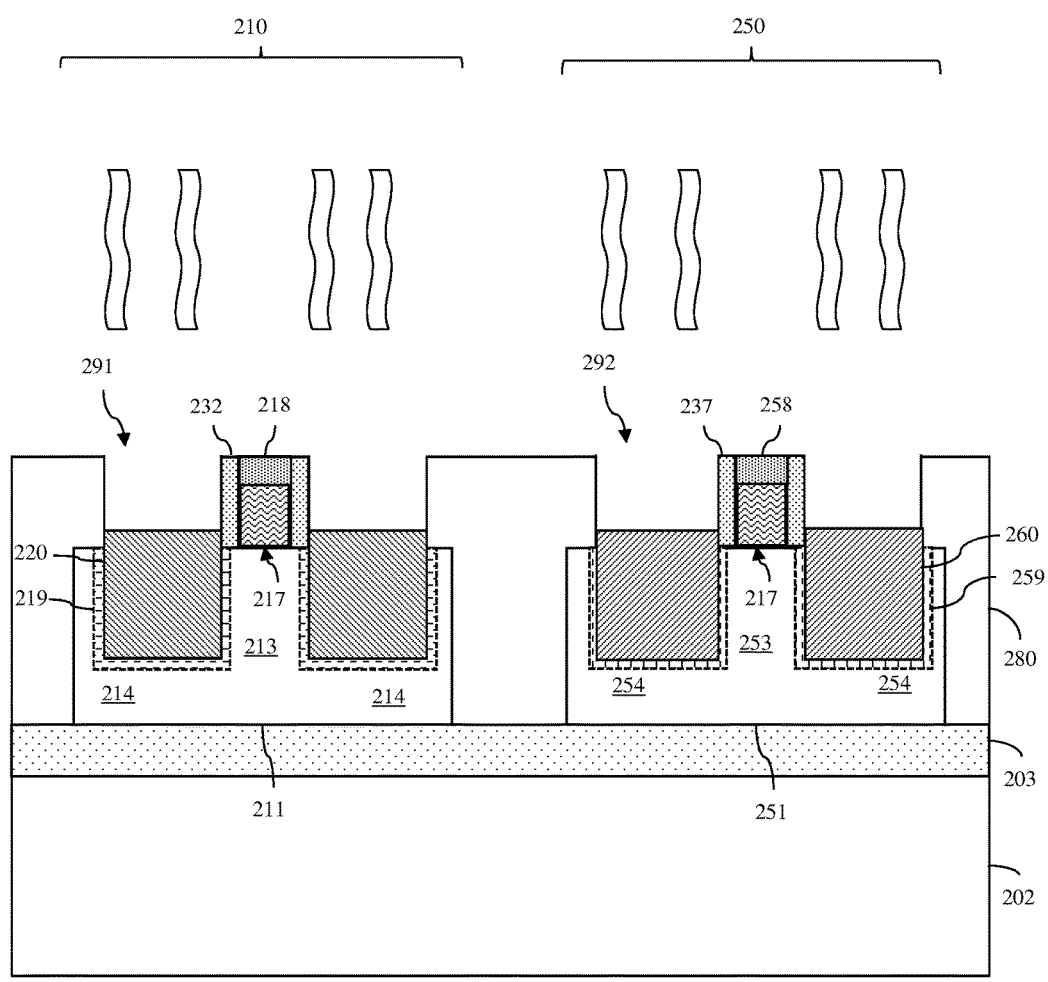

After the first source/drain regions 220 of the first FET 210 and the second source/drain regions 260 of the second FET 250 are formed, a dopant activation anneal process can be performed in order to activate the dopants (i.e., to activate first dopant in the first source/drain regions 220 and the second dopant in the second source/drain regions 260) (136, see FIG. 19). This dopant activation anneal process, for example, be a laser anneal process or other suitable anneal process. In an exemplary embodiment, the dopant activation anneal process can a nanosecond (nSec) laser anneal process that locally exposes the FETs 210 and 250 to 10-100 nSec temperature pulses. Such a nSec laser anneal process creates desirable metastable source/drain structures from a rapidly frozen melt, enabling dopant activation, while minimizing dopant diffusion, in order to retain clearly defined source/drain to channel region junctions.

Figure 20:
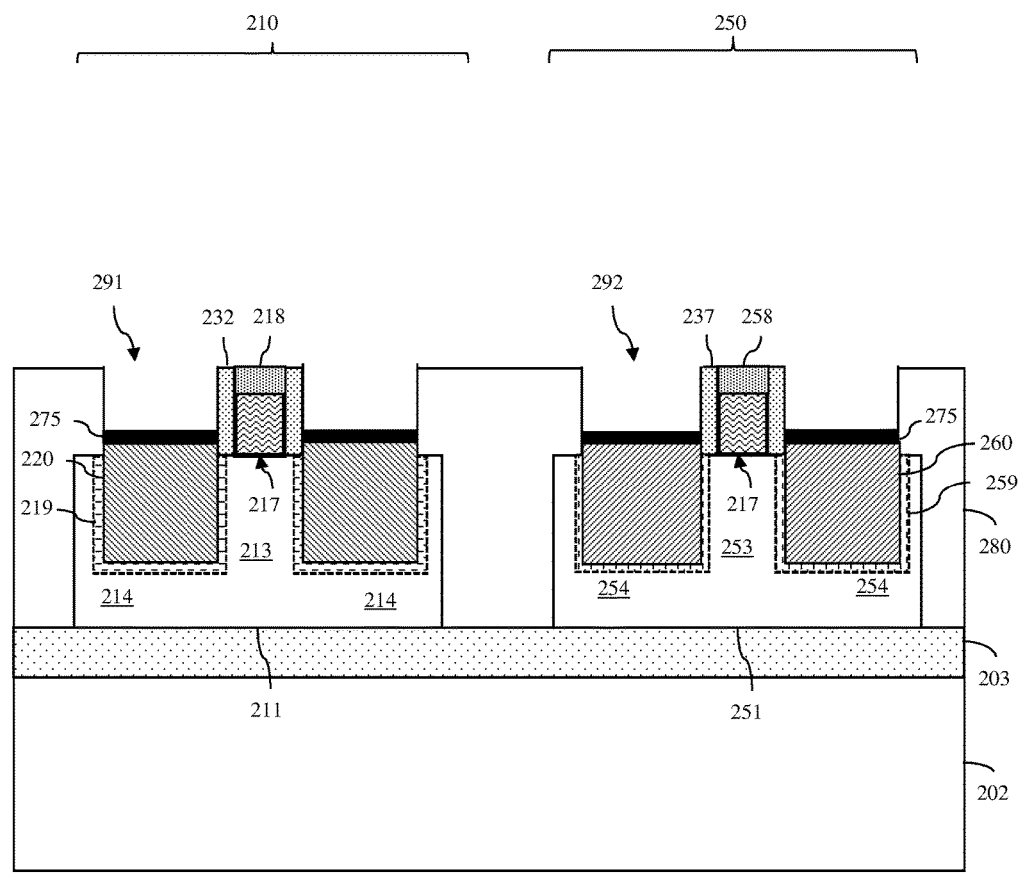

Following dopant activation, middle of the line (MOL) processing can be completed. For example, optionally, self-aligned silicide layers 275 can be formed on the top surface of the first source/drain regions 220 and the second source/drain regions 260 within the first openings 291 and second openings 292, respectively (138, see FIG. 20). The silicide layer 275 can be formed using conventional low-temperature self-aligned silicide processing techniques. For example, a layer of a refractory or noble metal (e.g., nickel (Ni), cobalt (Co), tungsten (W), chromium (Cr), platinum (Pt), titanium (Ti), molybdenum (Mo), palladium (Pd), etc.) or an alloy thereof can be conformally deposited over the partially completed structure and, specifically, onto the exposed semiconductor surfaces within the first opening 291 and the second opening 292. Next, a low temperature anneal process can be performed. Any metal remaining after the anneal process is performed can be selectively removed.

Figure 21:
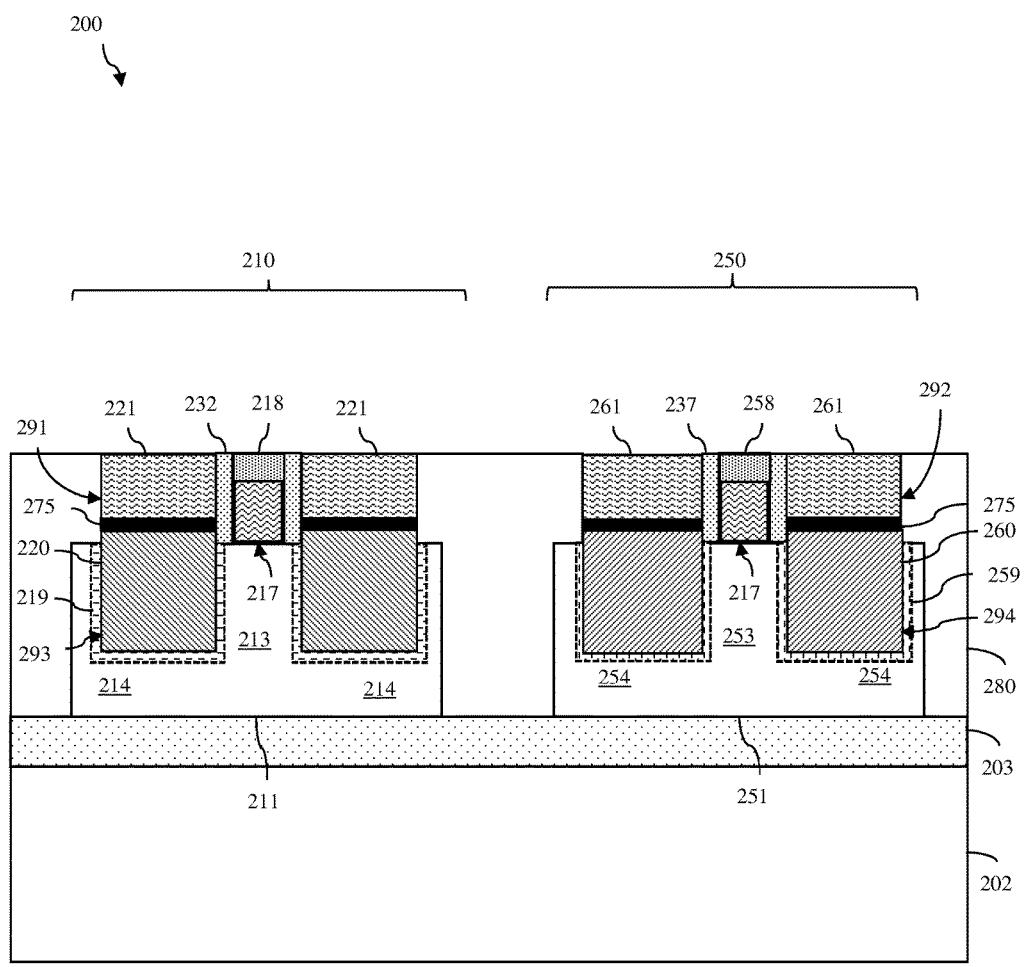
FIG. 21 is a cross-section diagram illustrating an integrated circuit structure with one or more field effect transistors formed according to the flow diagram of FIG. 1.

First metal plugs 221 and second metal plugs 261 can then be formed in the first opening 291 and the second openings 292 on the silicide layers 275 (if present) and above the first source/drain regions 220 and the second source/drain regions 260, respectively (140, see FIG. 21). To form the metal plugs, optionally, one or more conformal layers such as a conformal adhesive layer (e.g., a titanium adhesive layer) and/or a conformal barrier layer (e.g., titanium nitride barrier layer) can be deposited so as to line the first openings 291 and the second openings 292 (not shown). Then, a conductor and, particularly, a metal or metal alloy (e.g., tungsten, cobalt, aluminum or any other suitable metal plug material) can be deposited so as to fill the first openings 291 and the second openings 292. A polishing process (e.g., a CMP process) can then be performed to remove the liner/conductor materials from above the top surfaces of the ILD layer 280.

Additional MOL processing can include, but is not limited to, the formation of dielectric plug caps on the metal plugs, the formation of an additional ILD layer above the ILD layer, the formation of gate contacts that extend essentially vertically through the additional ILD layer to the gates and the formation of source/drain contacts that also extend essentially vertically through the additional ILD layer to the metal plugs. Following MOL processing, conventional back end of the line (BEOL) processing can be performed.

Referring to FIG. 22 also disclosed herein is an integrated circuit (IC) structure 200 that includes one or more field effect transistors (FETs), for example, at least one first FET 210 having a first type conductivity (e.g., an N-type FET (NFET)) and/or at least one second FET 250 having a second type conductivity that is different from the first type conductivity (e.g., a P-type FET (PFET)). Each FET 210, 250 can be a non-planar FET such as a fin-type FET (finFET), as shown, or a tri-gate FET. Alternatively, each FET 210, 250 can be a planar FET.

In any case, the IC structure 200 can be formed as a semiconductor-on-insulator structure (e.g., a silicon-on-insulator (SOI) structure) (as illustrated). That is, the IC structure 200 can include a substrate 202 (e.g., a silicon substrate or other suitable handler substrate), an insulator layer 203 (e.g., a buried oxide (BOX) layer) on the substrate 202 and a semiconductor layer (e.g., a silicon layer or other suitable semiconductor layer) on the insulator layer 203. Alternatively, the IC structure can be a bulk semiconductor structure (e.g., formed on a bulk silicon wafer or some other suitable bulk semiconductor wafer).

The first FET 210 (e.g., an NFET) can include a first semiconductor body 211. For a finFET (or trigate FET), the first semiconductor body 211 can be a fin-shaped semiconductor body (i.e., relatively thin, essentially rectangular semiconductor body, also referred to herein as a semiconductor fin). The first semiconductor body 211 can be, for example, a silicon body.

The first semiconductor body 211 can have first source/drain regions 220 and a first channel region 213 positioned laterally between the first source/drain regions 220. Specifically, the first semiconductor body 211 can have first source/drain trenches 293 on opposing sides of a first channel region 213. The first source/drain trenches 293 can be filled (and, optionally, overfilled, as discussed in greater detail below) with a first epitaxial semiconductor material, thereby forming the first source/drain regions 220. The first epitaxial semiconductor material can be different than the semiconductor material of the first semiconductor body 211. For example, if the first FET 210 is an NFET, the first epitaxial semiconductor material can be carbon-doped silicon or some other epitaxially deposited semiconductor material preselected to impart tensile strain on the first channel region 213 for optimal NFET performance. The first epitaxial semiconductor material can be doped with a first dopant so as to have a first type conductivity at a relatively high conductivity level (e.g., N+ conductivity). The first channel region 213 can be doped with a second dopant so as to have a second type conductivity at a relatively low conductivity level (e.g., P− conductivity). Alternatively, the channel region 213 can be undoped. Optionally, the first semiconductor body 211 can further have first doped regions 219 that border the first source/drain trenches. The first doped regions 219 can, for example, be doped with the same first dopant as the first source/drain regions 220 so as to have the first type conductivity.

The first FET 210 can further include a first gate 217 adjacent to the first semiconductor body 211 at the first channel region 213. For example, in the case of a finFET, the first gate 217 can be immediately adjacent to the opposing sides of the first semiconductor body 211 at the first channel region 213 and can further be positioned above the top surface of the first semiconductor body 211 at the first channel region 213. The first gate 217 can be a "gate first" structure (e.g., a gate structure formed with a silicon dioxide gate dielectric layer and a doped polysilicon gate conductor layer). Alternatively, the first gate 217 can be a "replacement metal gate" structure, see detailed discussion above regarding exemplary gate dielectric and gate conductor materials that can be used during formation of a replacement metal gate of an NFET for optimal NFET performance. The first gate 217 can have a first gate cap 218 and a first gate sidewall spacer 232.

The second FET 250 (e.g., a PFET) can include a second semiconductor body 251. For a finFET (or trigate FET), the second semiconductor body 251 can be a fin-shaped semiconductor body (i.e., relatively thin, essentially rectangular semiconductor body, also referred to herein as a semiconductor fin). The second semiconductor body 251 can be, for example, a silicon body.

The second semiconductor body 251 can have second source/drain regions 260 and a second channel region 253 positioned laterally between the second source/drain regions 260. Specifically, the second semiconductor body 251 can have second source/drain trenches 294 on opposing sides of a second channel region 253. The second source/drain trenches 294 can be filled (and, optionally, overfilled, as discussed in greater detail below) with a second epitaxial semiconductor material, thereby forming the second source/drain regions 260. The second epitaxial semiconductor material can be different than the semiconductor material of the second semiconductor body 251. For example, if the second FET 250 is a PFET, the second epitaxial semiconductor material can be germanium, silicon germanium or some other semiconductor material preselected to impart compressive strain on the second channel region 253 for optimal PFET performance. The second epitaxial semiconductor material can be doped with the second dopant so as to have the second type conductivity at a relatively high conductivity level (e.g., P+ conductivity). The second channel region 253 can be doped with the first dopant so as to have the first type conductivity at a relatively low conductivity level (e.g., N-conductivity). Alternatively, the second channel region 253 can be undoped. Optionally, the second semiconductor body 251 can further have second doped regions 259 that border the second source/drain trenches. The second doped regions 259 can, for example, be doped with the same second dopant as the second source/drain regions 260 so as to have the second type conductivity.

The second FET 250 can further include a second gate 257 adjacent to the second semiconductor body 251 at the second channel region 253. For example, in the case of a finFET, the second gate 257 can be immediately adjacent to the opposing sides of the second semiconductor body 251 at the second channel region and can further be positioned above the top surface of the second semiconductor body 251 at the second channel region 253. The second gate 257 can be a "gate first" structure (e.g., with a silicon dioxide gate dielectric layer and a doped polysilicon gate conductor layer). Alternatively, the gate 257 can be a "replacement metal gate" structure, see detailed discussion above regarding exemplary gate dielectric and gate conductor materials that can be used during formation of a replacement metal gate of a PFET for optimal PFET performance. The second gate 257 can have a second gate cap 258 and a second gate sidewall spacer 237.

An interlayer dielectric (ILD) layer 280 can cover portions of the semiconductor body of each FET 210 and/or 250 that extend laterally beyond the gates and gate sidewall spacers. In other words, the ILD layer 280 can cover the semiconductor bodies 211, 251 of each FET. The first gate 217 with the first gate sidewall spacer 232 can extend essentially vertically through the ILD layer 280 to the first semiconductor body 211 at the channel region 253. Similarly, the second gate 257 with the second gate sidewall spacer 237 can extend essentially vertically through the ILD layer 280 to the second semiconductor body 251 and the second channel region 253.

The ILD layer 280 can further have openings and, particularly, metal plug openings for each of FET 210 and/or 250. For example, the ILD layer 280 can further have first openings 291, which are on opposing sides of the first gate 217 and which extend essentially vertically through the ILD layer 280 to the first semiconductor body 211. The ILD layer 280 can further have second openings 292, which are on opposing sides of the second gate 257 and which extend essentially vertically through the ILD layer 280 to the second semiconductor body 251. As discussed above in greater detail with regard to the methods, the first openings 291 can be extended, during processing, into the first semiconductor body 211 to create the first source/drain trenches 293 and, thus, the first source/drain trenches 293 are aligned directly below the first openings 291. Similarly, the second openings 292 can be extended, during processing, into the second semiconductor body 251 to create the second source/drain trenches 294 and, thus, the second source/drain trenches 294 are aligned directly below the second openings 292.

It should be noted that in the case where the first epitaxial semiconductor material is deposited so as to overfill the first source/drain trenches 293, the first epitaxial semiconductor material and, thereby the first source/drain regions 220 will extend upward into the lower portions of the first openings 291, as illustrated. Similarly, in the case where the second epitaxial semiconductor material is deposited so as to overfill the second source/drain trenches 294, the second epitaxial semiconductor material and, thereby the second source/drain regions 260 will extend upward into the lower portions of the second openings 292.

The IC structure 200 can include silicide layers 275 within the first openings 291 on the first source/drain regions 220 of the first FET 210. Similarly, the IC structure 200 can include silicide layer 275 within the second openings 292 on the second source/drain regions 260 of the second FET 250.

The IC structure 200 can further include first metal plugs 221 in the first openings 291 on the silicide layers 275 (if present) and above the first source/drain regions 220 for the first FET 210. Similarly, the IC structure 200 can further include second metal plugs 261 in the second openings 292 on the silicide layers 275 (if present) and above the second source/drain regions 260 for the second FET 250. These metal plugs 221, 261 can include, for example, one or more conformal layers such as a conformal adhesive layer (e.g., a titanium adhesive layer) and/or a conformal barrier layer (e.g., titanium nitride barrier layer), which line the first openings 291 and the second openings 292 (not shown) and a conductor and, particularly, a metal or metal alloy (e.g., a tungsten, cobalt, aluminum or any other suitable metal plug material), which fill the remaining spaces within the openings.

It should be understood that, in the methods and structures described above, different dopants can be used to achieve the different conductivity types and it should be understood that the dopants may vary depending upon the different semiconductor materials used. For example, a silicon-based semiconductor material having N-type conductivity is typically doped with an N-type dopant (e.g., a Group V dopant, such as arsenic (As), phosphorous (P) or antimony (Sb)), whereas a silicon-based semiconductor material having P-type conductivity is typically doped with a P-type dopant (e.g., a Group III dopant, such as boron (B) or indium (In)). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/ or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). As used herein, the phrase "positioned laterally" refers to an element be positioned to one side of another element as opposed to above or below the other element as they are oriented in the drawings. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are methods of forming one or more field effect transistors (FETs). In the methods, instead of forming the source/drain (S/D) regions of each FET during front end of the line (FEOL) processing, the S/D regions are formed during middle of the line (MOL) processing and, particularly, through metal plug openings in an interlayer dielectric (ILD) layer. Processes used to form the S/D regions through the metal plug openings include S/D trench formation, epitaxial semiconductor material deposition, S/D dopant implantation and S/D dopant activation (e.g., using an anneal process, such as a nanosecond laser anneal or other suitable anneal process). These processes can be immediately followed by silicide and metal plug formation. Since the post-MOL processing thermal budget is relatively low, the methods ensure reduced S/D dopant deactivation, reduced S/D strain reduction, and reduced S/D dopant diffusion and, as a result, enable reduced S/D resistance, optimal strain engineering, and flexible junction control, respectively. Furthermore, since the S/D regions are formed through the metal plug openings, the methods eliminate the possibility of overlay errors that can lead to uncontacted or only partially contacted S/D regions. Also disclosed herein are structures formed according to such methods.

What is claimed is:

1. A method comprising:
   forming openings in an interlayer dielectric layer, the openings extending to a top surface of a fin-shaped semiconductor body and being positioned adjacent to opposing sides of a gate, the gate having a gate cap and being positioned adjacent to a channel region within the semiconductor body and the interlayer dielectric layer having a top surface that is essentially co-planar with a top surface of the gate cap;
   performing an etch process to further extend the openings into the semiconductor body to form source/drain trenches in the semiconductor body;
   depositing an epitaxial semiconductor material into the source/drain trenches to form source/drain regions, the epitaxial semiconductor material being at least one of in situ doped with a dopant and subsequently implanted with the dopant; and,
   performing a dopant activation anneal process.

2. The method of claim 1, the dopant activation anneal process comprising a nanosecond laser anneal process.

3. The method of claim 1, the etch process comprising an anisotropic etch process.

4. The method of claim 1,
   the semiconductor body comprising sacrificial source/ drain regions comprising previously etched trenches that are filled with sacrificial material,
   the channel region being positioned laterally between the sacrificial source/drain regions,
   the openings being formed in the interlayer dielectric layer so as to extend to the sacrificial source/drain regions, and
   the etch process comprising a selective etch process that selectively removes the sacrificial material from the previously etched trenches.

5. The method of claim 1, further comprising, after the etch process and before the depositing of the epitaxial semiconductor material, forming doped regions within the semiconductor body bordering the source/drain trenches.

6. The method of claim 1, further comprising, after the performing of the dopant activation anneal process, forming silicide layers on the source/drain regions.

7. The method of claim 6, further comprising:
   forming metal plugs in the openings on the silicide layers such that the gate is positioned laterally between the metal plugs; and performing a polishing process such that the metal plugs have a top surface that is essentially co-planar with top surface of the gate cap and the interlayer dielectric layer.

8. A method comprising:
forming first openings and second openings through an interlayer dielectric layer,
the first openings extending to a first top surface of a first semiconductor body for a first field effect transistor in a first device region and being positioned adjacent to first opposing sides of a first gate, the first gate being positioned adjacent to a first channel region within the first semiconductor body, and
the second openings extending to a second top surface of a second semiconductor body for a second field effect transistor in a second device region and being positioned adjacent to second opposing sides of a second gate, the second gate being positioned adjacent to a second channel region within the second semiconductor body;
performing an etch process to further extend the first openings into the first semiconductor body to form first source/drain trenches and the second openings into the second semiconductor body to form second source/drain trenches;
forming a first mask over the second device region;
depositing first epitaxial semiconductor material into the first source/drain trenches to form first source/drain regions, the first epitaxial semiconductor material being at least one of in situ doped with a first dopant and subsequently implanted with the first dopant;
removing the first mask;
forming a second mask over the first device region;
depositing second epitaxial semiconductor material into the second source/drain trenches to form second source/drain regions, the second epitaxial semiconductor material being at least one of in situ doped with a second dopant and subsequently implanted with the second dopant;
removing the second mask; and,
performing a dopant activation anneal process,
the first semiconductor body comprising first sacrificial source/drain regions comprising first previously etched trenches that are filled with sacrificial material, the first channel region being positioned laterally between the first sacrificial source/drain regions,
the second semiconductor body comprising second sacrificial source/drain regions comprising second previously etched trenches that are filled with the sacrificial material, the second channel region being positioned laterally between the second sacrificial source/drain regions,
the first openings and the second openings being formed so as to extend through the interlayer dielectric layer to the first sacrificial source/drain regions and the second sacrificial source/drain regions, respectively, and
the etch process comprising a selective etch process that selectively removes the sacrificial material from the first previously etched trenches and the second previously etched trenches.

9. The method of claim 8, the first field effect transistor comprising an n-type field effect transistor and the second field effect transistor comprising a p-type field effect transistor.

10. The method of claim 9,
the first semiconductor body and the second semiconductor comprising a silicon,
the first epitaxial semiconductor material comprising carbon-doped silicon,
the first dopant comprising any of phosphorous, arsenic and antimony,
the second epitaxial semiconductor material comprising any of germanium and silicon germanium, and
the second dopant comprising any of boron and indium.

11. The method of claim 8, the dopant activation anneal process comprising a nanosecond laser anneal process.

12. The method of claim 8, the etch process comprising an anisotropic etch process.

13. The method of claim 8, further comprising:
before the depositing of the first epitaxial semiconductor material, forming first doped regions within the first semiconductor body bordering the first source/drain trenches, and
before the depositing of the second epitaxial semiconductor material, forming second doped regions within the second semiconductor body bordering the second source/drain trenches.

14. The method of claim 8, further comprising, after the performing of the dopant activation anneal, forming silicide layers on the first source/drain regions and the second source/drain regions.

15. The method of claim 14, further comprising, forming metal plugs on the silicide layers in the first openings and in the second openings.

16. An integrated circuit structure comprising:
a fin-shaped semiconductor body having a channel region;
an interlayer dielectric layer on the semiconductor body;
a gate extending through the interlayer dielectric layer to the semiconductor body such that the gate is positioned adjacent to a top surface and opposing sides of the semiconductor body at the channel region,
the gate having a gate cap,
the interlayer dielectric layer having a top surface that is essentially co-planar with a top surface of the gate cap,
the interlayer dielectric layer having openings on opposing sides of the gate and extending essentially vertically to the semiconductor body, and
the semiconductor body having source/drain trenches aligned below the openings such that the channel region is positioned laterally between the source/drain trenches;
source/drain regions comprising epitaxial semiconductor material filling the source/drain trenches and extending up into the openings;
metal plugs in the openings above the source/drain regions, the metal plugs having top surfaces that are at or below a level of the top surface of the interlayer dielectric layer and the top surface of the gate cap; and
doped regions within the semiconductor body bordering the source/drain trenches.

17. The integrated circuit structure of claim 16, the source/drain regions and the semiconductor body comprising different semiconductor materials.

18. The integrated circuit structure of claim 16, further comprising silicide layers within the openings between the source/drain regions and the metal plugs.

* * * * *